United States Patent
Suzuki et al.

(10) Patent No.: US 11,562,900 B2
(45) Date of Patent: Jan. 24, 2023

(54) FORMATION OF SIOC THIN FILMS

(71) Applicant: ASM IP Holding B.V., Almere (NL)

(72) Inventors: Toshiya Suzuki, Helsinki (FI); Viljami J. Pore, Helsinki (FI); Hannu Huotari, Helsinki (FI)

(73) Assignee: ASM IP HOLDING B.V., Almere (NL)

( * ) Notice: Subject to any disclaimer, the term of this patent is extended or adjusted under 35 U.S.C. 154(b) by 0 days.

(21) Appl. No.: 16/811,258

(22) Filed: Mar. 6, 2020

(65) Prior Publication Data
US 2020/0273697 A1 Aug. 27, 2020

Related U.S. Application Data

(63) Continuation of application No. 15/588,026, filed on May 5, 2017, now Pat. No. 10,600,637.
(Continued)

(51) Int. Cl.
*C23C 16/32* (2006.01)
*H01L 21/02* (2006.01)
(Continued)

(52) U.S. Cl.
CPC ...... *H01L 21/02126* (2013.01); *C23C 16/325* (2013.01); *C23C 16/401* (2013.01); *C23C 16/4408* (2013.01); *C23C 16/45536* (2013.01); *H01L 21/0228* (2013.01); *H01L 21/02208* (2013.01); *H01L 21/02214* (2013.01); *H01L 21/02274* (2013.01)

(58) Field of Classification Search
CPC ....... C23C 16/30; C23C 16/325; C23C 16/40; C23C 16/401; C23C 16/45536
See application file for complete search history.

(56) References Cited

U.S. PATENT DOCUMENTS 3,708,728 A  1/1973 Sterling et al.
3,925,337 A  12/1975 Heiberger
(Continued)

FOREIGN PATENT DOCUMENTS

CN  104900513  9/2015
EP  0387403  9/1990
(Continued)

OTHER PUBLICATIONS

Knoops, Ham C., et al., "Status and prospects of plasma-assisted atomic layer deposition". Journal of Vacuum Science & Technology A 37(3), May/Jun. 2019, 030902 pp. 1-26. https://doi.org/10.1116/1.5088582.*

(Continued)

*Primary Examiner* — Bret P Chen
(74) *Attorney, Agent, or Firm* — Knobbe, Martens, Olson & Bear LLP

(57) ABSTRACT

Methods for depositing silicon oxycarbide (SiOC) thin films on a substrate in a reaction space are provided. The methods can include at least one plasma enhanced atomic layer deposition (PEALD) cycle including alternately and sequentially contacting the substrate with a silicon precursor that does not comprise nitrogen and a second reactant that does not include oxygen. In some embodiments the methods allow for the deposition of SiOC films having improved acid-based wet etch resistance.

19 Claims, 5 Drawing Sheets

Related U.S. Application Data

(60) Provisional application No. 62/332,975, filed on May 6, 2016, provisional application No. 62/427,077, filed on Nov. 28, 2016.

(51) Int. Cl.
  *C23C 16/40* (2006.01)
  *C23C 16/44* (2006.01)
  *C23C 16/455* (2006.01)

(56) References Cited

U.S. PATENT DOCUMENTS

| | | | |
|---|---|---|---|
| 4,058,430 A | 11/1977 | Suntola et al. | |
| 4,282,267 A | 8/1981 | Küyel | |
| 4,389,973 A | 6/1983 | Suntola et al. | |
| 4,565,747 A | 1/1986 | Nakae et al. | |
| 4,747,367 A | 5/1988 | Posa | |
| 4,761,269 A | 8/1988 | Conger et al. | |
| 4,767,494 A | 8/1988 | Kobayashi | |
| 4,851,095 A | 7/1989 | Scobey et al. | |
| 4,935,661 A | 6/1990 | Heinecke et al. | |
| 5,071,670 A | 12/1991 | Kelly | |
| 5,166,092 A | 11/1992 | Mochizuki et al. | |
| 5,221,556 A | 6/1993 | Hawkins et al. | |
| 5,270,247 A | 12/1993 | Sakuma et al. | |
| 5,281,274 A | 1/1994 | Yoder | |
| 5,306,666 A | 4/1994 | Izumi | |
| 5,316,793 A | 5/1994 | Wallace et al. | |
| 5,342,652 A | 8/1994 | Foster et al. | |
| 5,482,262 A | 1/1996 | Hayakawa et al. | |
| 5,595,784 A | 1/1997 | Kaim et al. | |
| 5,603,771 A | 2/1997 | Seiberras et al. | |
| 5,618,395 A | 4/1997 | Gartner | |
| 5,691,235 A | 11/1997 | Meikle et al. | |
| 5,693,139 A | 12/1997 | Nishizawa et al. | |
| 5,711,811 A | 1/1998 | Suntola et al. | |
| 5,723,384 A | 3/1998 | Park et al. | |
| 5,744,254 A | 4/1998 | Kampe et al. | |
| 5,769,950 A | 6/1998 | Takasu et al. | |
| 5,789,024 A | 8/1998 | Levy et al. | |
| 5,855,680 A | 1/1999 | Soininen | |
| 5,916,365 A | 6/1999 | Sherman | |
| 5,946,598 A | 8/1999 | Yeh | |
| 5,947,710 A | 9/1999 | Cooper et al. | |
| 5,964,943 A | 10/1999 | Stein et al. | |
| 5,965,004 A | 10/1999 | Cowley et al. | |
| 5,972,430 A | 10/1999 | DiMeo et al. | |
| 5,973,400 A | 10/1999 | Murakami et al. | |
| 6,006,763 A | 12/1999 | Mori et al. | |
| 6,015,590 A | 1/2000 | Suntola et al. | |
| 6,087,257 A | 7/2000 | Park et al. | |
| 6,099,904 A | 8/2000 | Mak et al. | |
| 6,104,074 A | 8/2000 | Chen | |
| 6,113,977 A | 9/2000 | Soininen et al. | |
| 6,124,158 A | 9/2000 | Dautartas et al. | |
| 6,139,624 A | 10/2000 | Rupp | |
| 6,139,700 A | 10/2000 | Kang et al. | |
| 6,144,060 A | 11/2000 | Park et al. | |
| 6,156,382 A | 12/2000 | Rajagopalan et al. | |
| 6,159,871 A | 12/2000 | Loboda et al. | |
| 6,162,501 A | 12/2000 | Kim | |
| 6,174,809 B1 | 1/2001 | Kang et al. | |
| 6,188,134 B1 | 2/2001 | Stumborg et al. | |
| 6,194,310 B1 | 2/2001 | Hsu et al. | |
| 6,200,389 B1 | 3/2001 | Miller et al. | |
| 6,203,613 B1 | 3/2001 | Gates et al. | |
| 6,206,967 B1 | 3/2001 | Mak et al. | |
| 6,234,646 B1 | 5/2001 | Ito | |
| 6,270,572 B1 | 8/2001 | Kim et al. | |
| 6,284,646 B1 | 9/2001 | Leem | |
| 6,287,965 B1 | 9/2001 | Kang et al. | |
| 6,342,277 B1 | 1/2002 | Sherman | |
| 6,355,561 B1 | 3/2002 | Sandhu et al. | |
| 6,380,627 B1 | 4/2002 | Weihs et al. | |
| 6,391,785 B1 | 5/2002 | Satta et al. | |
| 6,410,462 B1 | 6/2002 | Yang et al. | |
| 6,416,577 B1 | 7/2002 | Suntola et al. | |
| 6,464,779 B1 | 10/2002 | Powell et al. | |
| 6,475,276 B1 | 11/2002 | Elers et al. | |
| 6,482,262 B1 | 11/2002 | Elers et al. | |
| 6,482,733 B2 | 11/2002 | Raaijmakers et al. | |
| 6,482,740 B2 | 11/2002 | Soininen et al. | |
| 6,511,539 B1 | 1/2003 | Raaijmakers | |
| 6,534,395 B2 | 3/2003 | Werkhoven et al. | |
| 6,576,053 B1 | 6/2003 | Kim et al. | |
| 6,583,048 B2 | 6/2003 | Vincent et al. | |
| 6,599,572 B2 | 7/2003 | Saanila et al. | |
| 6,613,383 B1 | 9/2003 | George et al. | |
| 6,616,982 B2 | 9/2003 | Merrill et al. | |
| 6,632,595 B2 | 10/2003 | Kikuchi et al. | |
| 6,652,924 B2 | 11/2003 | Sherman | |
| 6,706,115 B2 | 3/2004 | Leskela et al. | |
| 6,727,169 B1 | 4/2004 | Raaijmakers et al. | |
| 6,780,704 B1 | 8/2004 | Raaijmakers et al. | |
| 6,794,287 B2 | 9/2004 | Saanila et al. | |
| 6,797,340 B2 | 9/2004 | Fang et al. | |
| 6,800,383 B1 | 10/2004 | Lakhotkin | |
| 6,800,552 B2 | 10/2004 | Elers et al. | |
| 6,809,026 B2 | 10/2004 | Yoon et al. | |
| 6,821,889 B2 | 11/2004 | Elers et al. | |
| 6,827,978 B2 | 12/2004 | Yoon et al. | |
| 6,833,161 B2 | 12/2004 | Wang et al. | |
| 6,863,727 B1 | 3/2005 | Elers et al. | |
| 6,902,763 B1 | 6/2005 | Elers et al. | |
| 6,986,914 B2 | 1/2006 | Elers et al. | |
| 7,015,153 B1 | 3/2006 | Triyoso et al. | |
| 7,045,406 B2 | 5/2006 | Huotari et al. | |
| 7,074,690 B1 | 7/2006 | Gauri et al. | |
| 7,115,534 B2 | 10/2006 | Nguyen et al. | |
| 7,115,974 B2 | 10/2006 | Wu et al. | |
| 7,138,336 B2 | 11/2006 | Lee et al. | |
| 7,211,144 B2 | 5/2007 | Lu et al. | |
| 7,211,508 B2 | 5/2007 | Chung et al. | |
| 7,268,078 B2 | 9/2007 | Iyer | |
| 7,329,590 B2 | 2/2008 | Elers et al. | |
| 7,351,668 B2 | 4/2008 | Chou et al. | |
| 7,405,158 B2 | 7/2008 | Lai et al. | |
| 7,410,666 B2 | 8/2008 | Elers et al. | |
| 7,416,981 B2 | 8/2008 | Lee et al. | |
| 7,422,776 B2 | 9/2008 | Yim et al. | |
| 7,611,751 B2 | 11/2009 | Elers | |
| 7,749,871 B2 | 7/2010 | Elers et al. | |
| 7,771,533 B2 | 8/2010 | Tois et al. | |
| 7,776,396 B2 | 8/2010 | Kobrin et al. | |
| 7,794,798 B2 | 9/2010 | Hautala | |
| 7,824,492 B2 | 11/2010 | Tois et al. | |
| 8,129,555 B2 * | 3/2012 | Cheng | C23C 16/345 546/14 |
| 8,217,446 B2 | 7/2012 | Fukuzumi et al. | |
| 8,298,628 B2 | 10/2012 | Yang et al. | |
| 8,637,411 B2 | 1/2014 | Swaminathan et al. | |
| 8,647,993 B1 | 2/2014 | LaVoie et al. | |
| 8,703,624 B2 | 4/2014 | Yang et al. | |
| 9,076,646 B2 | 7/2015 | Sims et al. | |
| 9,111,746 B2 | 8/2015 | Ranjan et al. | |
| 9,171,736 B2 | 10/2015 | Raley et al. | |
| 9,200,167 B2 | 12/2015 | Spence et al. | |
| 9,243,324 B2 | 1/2016 | Bowen et al. | |
| 9,287,113 B2 | 3/2016 | Kang et al. | |
| 9,425,038 B2 | 8/2016 | Shimizu | |
| 9,425,097 B1 | 8/2016 | Bouche et al. | |
| 9,443,718 B2 | 9/2016 | Harada et al. | |
| 9,455,138 B1 | 9/2016 | Fukazawa et al. | |
| 9,472,391 B2 | 10/2016 | Shimamoto et al. | |
| 9,564,309 B2 | 2/2017 | Niskanen et al. | |
| 9,784,695 B2 | 10/2017 | Blendl | |
| 9,786,491 B2 * | 10/2017 | Suzuki | H01L 21/02216 |
| 9,786,492 B2 | 10/2017 | Suzuki et al. | |
| 9,895,715 B2 | 2/2018 | Haukka et al. | |
| 10,008,428 B2 | 6/2018 | Kang et al. | |
| 10,032,626 B2 | 7/2018 | Noda et al. | |
| 10,134,757 B2 | 11/2018 | Chun et al. | |
| 10,186,420 B2 | 1/2019 | Fukazawa | |

(56) References Cited

U.S. PATENT DOCUMENTS

| Patent/Publication | Date | Inventor(s) |
|---|---|---|
| 10,424,476 B2 | 9/2019 | Suzuki et al. |
| 10,424,477 B2 | 9/2019 | Niskanen et al. |
| 10,453,675 B2 | 10/2019 | O'Neill |
| 10,504,901 B2 | 12/2019 | Yoo et al. |
| 10,510,529 B2 | 12/2019 | Suzuki et al. |
| 10,566,186 B2 * | 2/2020 | van Schravendijk ... H01L 43/12 |
| 10,600,637 B2 * | 3/2020 | Suzuki .................. C23C 16/401 |
| 10,787,591 B2 | 9/2020 | Tsotsis et al. |
| 10,847,529 B2 | 11/2020 | Yoo et al. |
| 10,991,573 B2 | 4/2021 | Jia et al. |
| 11,107,673 B2 | 8/2021 | Suzuki et al. |
| 2001/0004479 A1 | 6/2001 | Cheung et al. |
| 2001/0005546 A1 | 6/2001 | Cheung et al. |
| 2001/0024387 A1 | 9/2001 | Raaijmakers et al. |
| 2001/0034097 A1 | 10/2001 | Lim et al. |
| 2001/0041250 A1 | 11/2001 | Werkhoven et al. |
| 2002/0004293 A1 | 1/2002 | Soininen et al. |
| 2002/0104481 A1 | 8/2002 | Chiang et al. |
| 2002/0182320 A1 | 12/2002 | Leskela et al. |
| 2003/0015764 A1 | 1/2003 | Raaijmakers |
| 2003/0026989 A1 | 2/2003 | George et al. |
| 2003/0031793 A1 | 2/2003 | Chang et al. |
| 2003/0049931 A1 | 3/2003 | Byun et al. |
| 2003/0072975 A1 | 4/2003 | Shero et al. |
| 2003/0082296 A1 | 5/2003 | Elers et al. |
| 2003/0104126 A1 | 6/2003 | Fang et al. |
| 2003/0119305 A1 | 6/2003 | Huang et al. |
| 2003/0123216 A1 | 7/2003 | Yoon et al. |
| 2003/0127043 A1 | 7/2003 | Lu et al. |
| 2003/0153181 A1 | 8/2003 | Yoon et al. |
| 2003/0157760 A1 | 8/2003 | Xi et al. |
| 2003/0161952 A1 | 8/2003 | Wang et al. |
| 2003/0181035 A1 | 9/2003 | Yoon et al. |
| 2003/0194825 A1 | 10/2003 | Law et al. |
| 2003/0203616 A1 | 10/2003 | Chung et al. |
| 2004/0130029 A1 | 7/2004 | Raaijmakers et al. |
| 2004/0185183 A1 | 9/2004 | Srinivasan et al. |
| 2004/0206008 A1 | 10/2004 | Sung |
| 2004/0208994 A1 | 10/2004 | Harkonen et al. |
| 2004/0224504 A1 | 11/2004 | Gadgil |
| 2004/0231799 A1 | 11/2004 | Lee et al. |
| 2004/0238876 A1 | 12/2004 | Youn et al. |
| 2004/0240820 A1 | 12/2004 | Johnson et al. |
| 2005/0037557 A1 | 2/2005 | Doczy et al. |
| 2005/0106877 A1 | 5/2005 | Elers et al. |
| 2005/0215008 A1 | 9/2005 | Orlowski et al. |
| 2005/0236694 A1 | 10/2005 | Wu et al. |
| 2005/0271813 A1 | 12/2005 | Kher et al. |
| 2006/0019494 A1 | 1/2006 | Cao et al. |
| 2006/0078679 A1 | 4/2006 | Elers et al. |
| 2006/0079090 A1 | 4/2006 | Elers et al. |
| 2006/0079099 A1 | 4/2006 | Nguyen et al. |
| 2006/0165891 A1 | 7/2006 | Edelstein et al. |
| 2006/0165892 A1 | 7/2006 | Weidman |
| 2006/0211224 A1 | 9/2006 | Matsuda et al. |
| 2006/0223300 A1 | 10/2006 | Simka et al. |
| 2006/0240187 A1 | 10/2006 | Weidman |
| 2007/0054046 A1 | 3/2007 | Ishizaka et al. |
| 2007/0072427 A1 | 3/2007 | Fukushima et al. |
| 2007/0148350 A1 | 6/2007 | Rahtu et al. |
| 2007/0178699 A1 * | 8/2007 | Schaller ............ H01L 21/76808 438/689 |
| 2007/0218670 A1 | 9/2007 | Ishizaka |
| 2007/0232082 A1 | 10/2007 | Balseanu et al. |
| 2007/0251444 A1 | 11/2007 | Gros-Jean et al. |
| 2008/0081470 A1 | 4/2008 | Clark |
| 2008/0102204 A1 | 5/2008 | Elers |
| 2008/0102613 A1 | 5/2008 | Elers |
| 2008/0113110 A1 | 5/2008 | Elers et al. |
| 2008/0182411 A1 | 7/2008 | Elers |
| 2008/0274617 A1 | 11/2008 | Milligan |
| 2009/0081868 A1 | 3/2009 | Shah et al. |
| 2009/0104791 A1 | 4/2009 | Nemani |
| 2009/0211526 A1 | 8/2009 | Tanaka et al. |
| 2009/0315093 A1 | 12/2009 | Li et al. |
| 2010/0092781 A1 | 4/2010 | Zambov et al. |
| 2010/0136789 A1 * | 6/2010 | Matz ................. H01L 21/02216 438/687 |
| 2010/0148903 A1 | 6/2010 | Yin et al. |
| 2010/0239742 A1 | 9/2010 | Larson-Smith et al. |
| 2010/0297545 A1 * | 11/2010 | Yoo ....................... C09C 1/3081 430/108.3 |
| 2011/0159202 A1 * | 6/2011 | Matsushita ....... H01L 21/76826 427/509 |
| 2011/0262642 A1 | 10/2011 | Xiao et al. |
| 2011/0278533 A1 * | 11/2011 | Hillhouse .......... G01N 27/4075 257/9 |
| 2012/0003831 A1 | 1/2012 | Kang et al. |
| 2012/0070944 A1 | 3/2012 | Kim et al. |
| 2012/0119283 A1 | 5/2012 | Lee et al. |
| 2012/0141770 A1 | 6/2012 | Cadet et al. |
| 2012/0208347 A1 | 8/2012 | Hwang et al. |
| 2012/0269962 A1 | 10/2012 | Blomberg et al. |
| 2013/0034963 A1 | 2/2013 | Chung et al. |
| 2013/0078454 A1 | 3/2013 | Thompson et al. |
| 2013/0084714 A1 | 4/2013 | Oka et al. |
| 2013/0112605 A1 | 5/2013 | Wyndham et al. |
| 2013/0115763 A1 | 5/2013 | Takamure et al. |
| 2013/0134372 A1 | 5/2013 | Sakuma et al. |
| 2013/0196082 A1 | 8/2013 | Spence |
| 2013/0330935 A1 | 12/2013 | Varadarajan |
| 2014/0030432 A1 | 1/2014 | Leu et al. |
| 2014/0048131 A1 | 2/2014 | Tanaka et al. |
| 2014/0120737 A1 | 5/2014 | Swaminathan et al. |
| 2014/0272194 A1 * | 9/2014 | Xiao ................. H01L 21/02219 427/577 |
| 2014/0273477 A1 | 9/2014 | Niskanen et al. |
| 2014/0295109 A1 | 10/2014 | Sakakura |
| 2014/0302267 A1 | 10/2014 | Wynne et al. |
| 2014/0349107 A1 | 11/2014 | Thoumazet et al. |
| 2014/0367764 A1 | 12/2014 | Lee et al. |
| 2015/0087156 A1 * | 3/2015 | Kamimura ............. C09K 13/02 438/704 |
| 2015/0118862 A1 | 4/2015 | Reilly et al. |
| 2015/0118865 A1 | 4/2015 | Shimizu |
| 2015/0126042 A1 | 5/2015 | Pasquale et al. |
| 2015/0214103 A1 | 7/2015 | Matsuda |
| 2015/0217240 A1 | 8/2015 | Van Tuel et al. |
| 2015/0217330 A1 | 8/2015 | Haukka et al. |
| 2015/0252477 A1 | 9/2015 | Nguyen et al. |
| 2015/0275355 A1 | 10/2015 | Mallikarjunan et al. |
| 2015/0303056 A1 | 10/2015 | Varadarajan et al. |
| 2015/0303101 A1 | 10/2015 | Blomberg et al. |
| 2015/0376211 A1 | 12/2015 | Girard et al. |
| 2015/0380302 A1 | 12/2015 | Mountsier et al. |
| 2016/0064281 A1 | 3/2016 | Izumi et al. |
| 2016/0093485 A1 * | 3/2016 | Kobayashi ........ C23C 16/45542 438/763 |
| 2016/0225616 A1 | 8/2016 | Li et al. |
| 2016/0322214 A1 * | 11/2016 | Li ........................ C23C 16/345 |
| 2016/0336338 A1 | 11/2016 | Song et al. |
| 2017/0140924 A1 | 5/2017 | Suzuki et al. |
| 2017/0213726 A1 | 7/2017 | Saley et al. |
| 2017/0309476 A1 | 10/2017 | Venkatasubramanian et al. |
| 2017/0323782 A1 * | 11/2017 | Suzuki ................ H01L 21/0228 |
| 2017/0352680 A1 | 12/2017 | Shin et al. |
| 2017/0365462 A1 * | 12/2017 | Varadarajan .......... C23C 16/505 |
| 2018/0005814 A1 | 1/2018 | Kumar et al. |
| 2018/0013078 A1 | 1/2018 | Lee et al. |
| 2018/0122632 A1 | 5/2018 | Vrtis et al. |
| 2018/0122742 A1 | 5/2018 | Ha et al. |
| 2018/0151355 A1 | 5/2018 | Fukazawa |
| 2018/0182618 A1 | 6/2018 | Blanquart et al. |
| 2018/0315758 A1 | 11/2018 | Yoo et al. |
| 2018/0330945 A1 * | 11/2018 | Varadarajan ...... H01L 21/76831 |
| 2018/0350587 A1 | 12/2018 | Jia et al. |
| 2020/0075322 A1 | 3/2020 | Suzuki et al. |

(56) References Cited

U.S. PATENT DOCUMENTS

| | | |
|---|---|---|
| 2020/0395211 A1 | 12/2020 | Jia et al. |
| 2021/0035988 A1 | 2/2021 | Yoo et al. |

FOREIGN PATENT DOCUMENTS

| | | | |
|---|---|---|---|
| EP | 0394054 | 10/1990 | |
| EP | 0442490 | 8/1991 | |
| EP | 0526779 | 2/1993 | |
| EP | 0528779 | 2/1993 | |
| EP | 0573033 | 12/1993 | |
| EP | 0774533 | 5/1997 | |
| EP | 0899779 | 3/1999 | |
| EP | 1158070 | 11/2001 | |
| EP | 1167567 | 1/2002 | |
| EP | 2620440 | 7/2013 | |
| EP | 3196336 | 7/2017 | |
| JP | 58-033841 | 2/1983 | |
| JP | H06-037041 | 2/1994 | |
| JP | H06-069157 | 3/1994 | |
| JP | H07-230957 | 8/1995 | |
| JP | H08-264530 | 10/1996 | |
| JP | H0955365 | 2/1997 | |
| JP | 09-087857 | 3/1997 | |
| JP | 2003-276111 | 9/2003 | |
| JP | 2003342731 | 12/2003 | |
| JP | 2004-288979 | 10/2004 | |
| JP | 2006-040936 | 2/2006 | |
| JP | 2008-544533 | 12/2008 | |
| JP | 2009-083511 | 4/2009 | |
| JP | 2010219533 | 9/2010 | |
| JP | 2012-169408 | * 9/2012 | ......... H01L 21/3065 |
| JP | 2014-096599 | 5/2014 | |
| JP | 2014135475 | 7/2014 | |
| JP | 2014229834 | 12/2014 | |
| JP | 2015-053445 | 3/2015 | |
| JP | 2015-088562 | 5/2015 | |
| JP | 2015144268 | 8/2015 | |
| JP | 2015523917 | 8/2015 | |
| JP | 2015-170614 | 9/2015 | |
| KR | 2003-0016346 | 2/2003 | |
| KR | 2003-0057938 | 7/2003 | |
| KR | 2003-0093575 | 12/2003 | |
| KR | 2004-0060402 | 7/2004 | |
| KR | 2004-0079173 | 9/2004 | |
| KR | 2004-0079175 | 9/2004 | |
| KR | 2004-0100767 | 12/2004 | |
| KR | 2005-0000168 | 1/2005 | |
| KR | 10-2009-0060768 | * 6/2009 | ........... H01L 21/205 |
| KR | 2009-0060768 | 6/2009 | |
| KR | 2018-005128 | 1/2018 | |
| TW | 2010210202 | 1/2010 | |
| TW | 201403759 | 1/2014 | |
| TW | 201615880 | 5/2016 | |
| WO | WO 96/17107 | 6/1996 | |
| WO | WO 96/18756 | 6/1996 | |
| WO | WO 98/51838 | 11/1998 | |
| WO | WO 99/37655 | 7/1999 | |
| WO | WO 00/01006 | 1/2000 | |
| WO | WO 00/04704 | 1/2000 | |
| WO | WO 00/40772 | 7/2000 | |
| WO | WO 00/47404 | 8/2000 | |
| WO | WO 00/47796 | 8/2000 | |
| WO | WO 00/54320 | 9/2000 | |
| WO | WO 00/55895 | 9/2000 | |
| WO | WO 00/63957 | 10/2000 | |
| WO | WO 01/27347 | 4/2001 | |
| WO | WO 01/29280 | 4/2001 | |
| WO | WO 01/29891 | 4/2001 | |
| WO | WO 01/29893 | 4/2001 | |
| WO | WO 01/53565 | 7/2001 | |
| WO | WO 01/66832 | 9/2001 | |
| WO | WO 01/78213 | 10/2001 | |
| WO | WO 01/88972 | 11/2001 | |
| WO | WO 2004/077515 | 9/2004 | |
| WO | WO 2006/080782 | 8/2006 | |
| WO | WO 2006/097525 | 9/2006 | |
| WO | WO 2007/041089 | 4/2007 | |
| WO | WO 2008/051851 | 5/2008 | |
| WO | WO 2008/121478 | 10/2008 | |
| WO | WO 2008/137399 | 11/2008 | |
| WO | WO 2013/043330 | 3/2013 | |
| WO | WO 2013/054655 | 4/2013 | |
| WO | WO2016/042663 | 3/2016 | |
| WO | WO 2018/204709 | 11/2018 | |
| WO | WO 2018/213018 | 11/2018 | |

OTHER PUBLICATIONS

Varadarajan, Bhadri, et al., "SPARC: A novel technology for depositing conformal dielectric thin films with compositional tuning for etch selectivity". Proc. SPIE 10963, Advanced Etch Technology for Nanopatterning VIII, (Mar. 20, 2019), 1096307, pp. 1-13, doi: 10.1117/12.2517407.*

Asami, N., et al., "Novel low-k SiOC (k=2.4) with superior tolerance to direct polish and ashing for advanced BEOL integration". 2009 IEEE International Interconnect Technology Conference, 2009, pp. 161-162, doi: 10.1109/IITC.2009.5090373.*

Lee, Kwang-Man, et al., "Characteristics of SiOC(—H) Thin Films Prepared by Using Plasma-enhanced Atomic Layer Deposition". Journal of the Korean Physical Society, vol. 59, No. 5, Nov. 2011, pp. 3074-3079.*

Song, Seokhwi, et al., "Carbon content control of silicon oxycarbide film with methane containing plasma". J. Vac. Sci. Technol. A 38, 062401 (2020), pp. 1-7.*

File History of U.S. Appl. No. 17/072,480, filed Oct. 16, 2020.

1988RD-0296076 (Nov. 20, 1998), Field effect transistor structure with improved transconductant-contg. spacer-less conducting gate oxide, and tungsten deposited on source and drain, EAST Version 2.0.1.4 Patent-Assignee: Anonymous[ANON], Sep. 19, 2005.

Aarik et al., "Influence of substrate temperature on atomic layer growth and properties of HfO2 thin films", Thin Solid Films, vol. 340, 1999, pp. 110-116.

Alen et al., "Atomic Layer Deposition of Ta(Al)N(C) Thin Films Using Trimethylaluminum as a Reducing Agent", Journal of the Electrochemical Society, vol. 148, No. 10, pp. G566-G571, 2001.

Amano et al., "Improved brushing durability of titanium dioxide coating on polymethyl methacrylate substrate by prior treatment with acryloxypropyl trimethoxysilane-based agent for denture application", Dental Materials Journal 2010, 29(1): pp. 97-103.

Bain et al., Deposition of tungsten by plasma enhanced chemical vapour deposition, J. Phys. IV France, 1999, vol. 9, pp. 827-833.

Chang et al, "Chemical Vapor Deposition of Tantalum Carbide and Carbonitride Thin Films from Me3CE=Ta(CH2CMe3)3 (E=CH, N)," J. Mater. Chem. 13:365-369 (2003).

Chookarjorn et al, "Design of Stable Nanocrystalline Alloys," Science Magazine, vol. 337, pp. 951-954, Aug. 24, 2012.

Closser et al., "Molecular Layer Deposition of a Highly Stable Oxycarbide Thin Film Using an Organic Chlorosilane and Water", ACS Appl. Mater. Interfaces 2018, 10, pp. 24266-24274.

Diaz-Benito et al., "Hydrolysis study of bis-1,2-(triethoxylsilyl)ethane silane by NMR", Colloids and Surfaces A; Physicochemical and Engineering Aspects, 369 (2010), pp. 53-56.

Elers et al., NbCl5 as a precursor in atomic layer epitaxy, Applied Surface Science, Jul. 9, 1994, vol. 82/83, pp. 468-474.

Favis et al., Atomic layer epitaxy of silicon, silicon/germanium and silicon carbide via extraction/exchange processes, Avail. NTIS. Report, 1991, pp. 33.

File History of U.S. Appl. No. 14/939,984, filed Nov. 12, 2015.
File History of U.S. Appl. No. 15/707,749, filed Sep. 18, 2017.
File History of U.S. Appl. No. 16/576,328, filed Sep. 19, 2019.
File History of U.S. Appl. No. 15/707,878, filed Sep. 18, 2017.
File History of U.S. Appl. No. 15/588,026, filed May 5, 2017.
File History of U.S. Appl. No. 16/603,555, filed Oct. 7, 2019.
File History of U.S. Appl. No. 15/787,342, filed Oct. 18, 2017.
File History of U.S. Appl. No. 15/951,626, filed Apr. 12, 2018.
File History of U.S. Appl. No. 15/951,644, filed Apr. 12, 2018.
File History of U.S. Appl. No. 16/208,350, filed Dec. 3, 2018.

(56) References Cited

OTHER PUBLICATIONS

Fuyuki et al., Atomic layer epitaxy controlled by surface superstructures in silicon carbide, Thin Solid Films, 1993, vol. 225, Issue 1-2, pp. 225-229.
Fuyuki et al., Atomic layer epitaxy of cubic silicon carbide by gas source MBE using surface superstructure, J. Cryst. Growth, 1989, vol. 95, Issue 1-4, pp. 461-463.
Gallis et al., "White light emission from amorphous silicon oxycarbide (a-SiCxOy) thin films: Role of composition and postdeposition annealing", Applied Physics Letters 97, 2010, pp. 0810905-1-0810905-3.
Girolami et al., Tailored Organometallics as Low-Temperature CVD Precursors to Thin Films, Materials Research Society Symposium Proceedings, 1988, vol. 121, pp. 429-438.
Gordon et al., "A Kinetic Model for Step Coverage by Atomic Layer Deposition in Narrow Holes or Trenches", Chemical Vapor Deposition, 2003, vol. 9, No. 2, pp. 73-78.
Hara et al., Atomic layer control of .beta.-silicon carbide (001) surface, Springer Proc. Phys., 1992, pp. 90-95.
Hiltunen et al., Nitrides of titanium, niobium, tantalum and molybdenum grown as thin films by the atomic layer epitaxy method, Thin Solid Films, 1988, vol. 166, pp. 149-154.
Hultman et al., "Review of the Thermal and Mechanical Stability of TiN-based Thin Films" Zeitscrift Fur Metallkunde 90 (10): 803-813 (1999).
Ibrahim et al., "Organosilica bis(triethoxysilyl)ethane (BTESE) membranes for gas permeation (GS) and reverse osmosis (RO): The effect of preparation conditions on structure, and the correlation between gas and liquid permeation properties", Journal of Membrane Science, 526 (2017), pp. 242-251.
Ihanus et al., "ALE growth of ZnS1—xSex thin films by substituting surface sulfur with elemental selenium," Appl. Surface Sci., 112:154-158 (1997).
International Search Report and Written Opinion dated Apr. 7, 2008, Application No. PCT/US2007/082131.
International Search Report and Written Opinion dated Jun. 25, 2015 in Application No. PCT/US2015/023492.
Jehn et al., Gmelin Handbook of Inorganic and Organometallic Chemistry, 8th Edition, 1993, vol. A 5b, Issue 54, pp. 131-154.
Jeon et al., A Study on the Characteristics of TiN Thin Film Deposited by Atomic Layer Chemical Vapor Deposition Method, J. Vac .Sci. Technol. A, 2000, vol. 18, Issue 4, pp. 1595-1598.
Juppo et al., Deposition of copper films by an alternate supply of CuCl and Zn, J. Vac. Sci. Technol A, Jul./Aug. 1997, vol. 15, Issue 4, pp. 2330-2333.
Kattelus et al., "Electrical Properties of Tantalum Based Composite Oxide Films," Mat. Res. Soc. Symp. Proc. vol. 284, pp. 511-516 (1993).
Kattelus et al., "Layered tantalum-aluminum oxide films deposited by atomic layer epitaxy," Thin Solid Films, Vo. 225, pp. 296-298 (1993).
Kim et al., Atomic-layer-deposited WNxCy thin films as diffusion barrier for copper metallization, Applied Physics Letters, Jun. 23, 2003, vol. 82, Issue 25, pp. 4486-4488.
Kim et al., "Novel capacitor technology for high density stand-alone and embedded DRAMs," IEEE International Electron Devices Meeting, IEDM (2000).
Kirk-Othmer, Encyclopedia of Chemical Technology, John Wiley & Sons, Inc., 1992, vol. 4, pp. 841-878.
Klaus et al., Atomic Layer Deposition of Tungsten Nitride Films Using Sequential Surface Reactions, Journal of the Electrochemical Society, 2000, vol. 147, Issue 3, pp. 1175-1181.
Klaus et al., Atomic layer deposition of tungsten using sequential surface chemistry with a sacrificial stripping reaction, Thin Solid Films, 2000, vol. 360, pp. 145-153.
Klaus et al., Atomic layer deposition of tungsten and tungsten nitride using sequential surface reactions, AVS 46th International Symposium, 1999, Seattle, WA, US.
Klaus et al., Atomically controlled growth of tungsten and tungsten nitride using sequential surface reactions, Applied Surface Science, 2000, vol. 162-163, pp. 479-491.
Lai et al., Precursors for Organometallic Chemical Vapor Deposition of Tungsten Carbide Films, Chem. Mater., 1995, vol. 7, pp. 2284-2292.
Lakomaa et al., "Surface reactions in Al2O3 growth from trimethylaluminum and water by atomic layer epitaxy," Applied Surface Science, vol. 107, pp. 107-115 (1996).
Lee et al., "Characteristics of low-k SiOC films deposited via atomic layer deposition", Thin Solid Films 645 (2018), pp. 334-339.
Leskelä et al., ALD precursor chemistry: Evolution and future challenges, Jour. Phys. IV France 9, 1999, pp. 837-852.
Ludviksson et al., Low-Temperature Thermal CVD of Ti—Al Metal Films Using a Strong Reducing Agent, Chem. Vap. Deposition, 1998, vol. 4, Issue 4, pp. 129-132.
Martensson, Use of atomic layer epitaxy for fabrication of Si/TiN/Cu structures, J. Vac. Sci. Technol. B, Sep./Oct. 1999, vol. 17, Issue 5, pp. 2122-2128.
Martensson et al., Atomic Layer Epitaxy of Copper and Tantalum, Chemical Vapor Deposition, 1997, vol. 3, Issue 1, pp. 45-50.
Martensson et al., CU(THD)2 As Copper Source in Atomic Layer Epitaxy, Electrochemical Society Proceedings, vol. 97-25, (1997) pp. 1529-1536.
Matsunami et al., Hetero-interface control and atomic layer epitaxy of SiC, Applied Surface Science, 1997, vol. 112, pp. 171-175.
Min et al., Atomic Layer Deposition of TiN Films by Alternate Supply of Tetrakis (ethylmethylamino)-Titanium and Ammonia, Jpn. J. Appl. Phys., 1998, vol. 37, pp. 4999-5004.
Min et al., Atomic Layer Deposition of TiN Thin Films by Sequential Introduction of Ti Precursor and HN3, Mat. Res. Soc. Symp. Proc., 1998, vol. 514, pp. 337-342.
Nakajima et al., Chemical Vapor Deposition of Tungsten Carbide, Molybdenum Carbide Nitride, and Molybdenum Nitride Films, J. Electrochem. Soc., Jun. 1997, vol. 144, Issue 6, pp. 2096-2100.
Polyakov et al., Growth of GaBN Ternary Solutions by Organometallic Vapor Phase Epitaxy, Journal of Electronic Materials, 1997, vol. 26, Issue 3, pp. 237-242.
Ritala et al., Atomic layer epitaxy growth of TiN thin films, J. Electrochem. Soc., 1995, vol. 142, Issue 8, pp. 2731-2737.
Ritala et al., Atomic Layer Epitaxy Growth of TiN Thin Films from Til4 and NH3, J. Electrochem. Soc., Aug. 1998, vol. 145, Issue 8, pp. 2914-2920.
Ritala et al., "Controlled Growth of TaN, Ta3N5, and TaOxNy Thin Films by Atomic Layer Deposition", Chem. Mater., 1999, vol. 11, pp. 1712-1718.
Ritala et al., Effects of intermediate zinc pulses on properties of TiN and NbN films deposited by atomic layer epitaxy, Appl. Surf. Sci., 1997, vol. 120, pp. 199-212.
Ritala et al., Perfectly conformal TiN and Al2O3 films deposited by atomic layer deposition, Chem. Vapor Deposition, 1999, vol. 5, pp. 7-9.
Ritala et al., Surface roughness reduction in atomic layer epitaxy grown of titanium dioxide thin films, Thin Solid Films, vol. 249, pp. 155-162 (1994).
Sadayuki et al., Sub-atomic layer growth of SiC at low temperatures, Japanese Journal of Applied Physics, 1995, vol. 34, Issue 11, pp. 6166-6170.
Sherman et al., Plasma enhanced atomic layer deposition of Ta for diffusion barrier applications, AVS 46th International Symposium, Oct. 26, 1999, Seattle, WA, US.
Song et al., "Formation of Tantalum Carbide and Nitride Phases in Atomic Layer Deposition Using Hydrogen Plasm and tert-Butylimido-tris(diethylamido)-tantalum (TBTDET), and its Effect on Material Properties", Chemical Vapor Deposition, 2008, vol. 14, pp. 334-338.
Suntola, "Atomic Layer Epitaxy," Handbook of Crystal Growth 3, Ch. 14, pp. 601-663 (1994).
Teo et al., "Pre-treatments applied to oxidized aluminum surfaces to modify the interfacial bonding with bis-1, 2-(triethoxysilyl) ethane (BTSE)—Part I. High-purity Al with native oxide", Applied Surface Science 252(5), 2005, pp. 1293-1304.

(56) References Cited

OTHER PUBLICATIONS

Teo et al., "Pre-treatments applied to oxidized aluminum surfaces to modify the interfacial bonding with bis-1,2-(triethoxysilyl) ethane (BTSE)—Part II. Anodized 7075-T6 Al alloy", Applied Surface Science 252(5), 2005, pp. 1305-1312.

Tulhoff et al., Ullmann's Encyclopedia of Industrial Chemistry, 5th, Completely Revised Edition, 1986, vol. A5, pp. 61-77.

U.S. Appl. No. 10/049,125, filed Aug. 20, 2002 including prosecution history, including but not limited to, Office Action dated Apr. 8, 2004, Office Action dated Jun. 18, 2003, and Office Action dated Oct. 27, 2003.

U.S. Appl. No. 10/242,368, filed Sep. 12, 2002 including prosecution history, including but not limited to, Office Action dated Oct. 20, 2004, Office Action dated Apr. 27, 2004, and Notice of Allowance dated Jul. 19, 2005.

U.S. Appl. No. 10/969,297, filed Oct. 19, 2004 including prosecution history, including but not limited to, Office Action dated Oct. 11, 2006, Office Action dated Apr. 12, 2007, and Notice of Allowance dated Sep. 18, 2007.

U.S. Appl. No. 11/286,203, filed Nov. 22, 2005 including prosecution history, including but not limited to Office Action dated Sep. 28, 2007.

U.S. Appl. No. 11/288,872, filed Nov. 28, 2005 including prosecution history, including but not limited to, Office Action dated Jul. 2, 2007, Office Action dated Jan. 30, 2008, Office Action dated Sep. 9, 2008, Office Action dated Dec. 4, 2008, and Office Action dated Aug. 20, 2009.

U.S. Appl. No. 11/591,845, filed Nov. 1, 2006 including prosecution history, including but not limited to, Office Action dated Sep. 4, 2008, Office Action dated May 28, 2009, and Notice of Allowance dated Sep. 4, 2009.

U.S. Appl. No. 14/939,984, filed Nov. 12, 2015 including prosecution history, including but not limited to, Office Action dated Feb. 3, 2017, and Notice of Allowance dated Jun. 7, 2017.

U.S. Appl. No. 15/342,943, filed Nov. 3, 2016 including prosecution history, including but not limited to Notice of Allowance dated Jun. 13, 2017.

U.S. Appl. No. 14/255,799, filed Apr. 17, 2014 including prosecution history, including but not limited to, Office Action dated Dec. 1, 2016, Final Office Action dated Aug. 29, 2017, and Advisory Action dated Dec. 21, 2017.

Utriainen et al., "Controlled Electrical Conductivity in SnO2 Thin Films by Oxygen or Hydrocarbon Assisted Atomic Layer Epitaxy," J. Electrochem. Soc. 146(1):189-193 (1999).

Wahab et al., "Hybrid periodic mesoporous organosilica materials prepared from 1,2-bis(triethoxysilyl)ethane and (3-cyanopropyl)triethoxysilane", Microporous and Mesoporous Materials 69 (2004), pp. 19-27.

Wong et al., Barriers for copper interconnections, Solid State Technology, 1999, pp. 1-7.

Wrobel et al., "Silicon Oxycarbide Films Produced by Remote Microwave Hydrogen Plasma CVD using a Tetramethyldisiloxane Precursor: Growth Kinetics, Structure, Surface Morphology, and Properties", Chem. Vap. Deposition 2015, 21, pp. 307-318.

Yang et al., Atomic Layer Deposition of Tungsten Film from WF6/B2H6: Nucleation Layer for Advanced Semiconductor Devices, Advanced Metallization Conference 2001 (AMC 2001), Conference Proceedings ULSI XVII@2002 Materials Research Society, 2001, pp. 655-660.

Zhang et al., "High permittivity thin film nanolaminates," Journal of Applied Physics, vol. 87, No. 4, pp. 1921-1924 (2000).

Andricacos et al., "Damascene copper electroplating for chip", IBM Jour. Research and Dev., 1998, vol. 42, Issue 5, pp. 567-574.

Kukli et al., "Properties of (Nb1—xTax)2O5 Solid Solutions and (Nb1—xTax)2O5—ZrO2 Nanolaminates Growth by Atomic Layer Epitaxy", NanoStructured Materials, 1997, vol. 8, pp. 785-793.

\* cited by examiner 1. 
2. 
3. 
4. 
5. 
6. 
7. 
8. 
9. 
10. 
11.

FORMATION OF SIOC THIN FILMS

REFERENCE TO RELATED APPLICATION

The present application is a continuation of U.S. application Ser. No. 15/588,026, filed May 5, 2017, now U.S. Pat. No. 10,600,637, which claims priority to U.S. Application No. 62/332,975, filed May 6, 2016 and U.S. Application No. 62/427,077, filed Nov. 28, 2016, each of which is hereby incorporated by reference in its entirety.

BACKGROUND

Field

The present disclosure relates generally to the field of semiconductor device manufacturing and, more particularly, to formation of silicon oxycarbide (SiOC) films having desirable chemical resistance properties.

Description of the Related Art

There is increasing need for dielectric materials with relatively low dielectric constant (k) values and relatively low acid-based wet etch rates. Silicon oxycarbide or silicon oxycarbonitride (SiOCN) may satisfy certain of these requirements. Typically, deposition processes for SiOC or SiOCN require oxygen plasma. Further, the nitrogen in a SiOCN film may cause problems during processing, for example, an SiOCN film may cause photoresist poisoning.

SUMMARY

In some embodiments plasma enhanced atomic layer deposition processes are provided for forming a silicon oxycarbide (SiOC) thin film on a substrate in a reaction space. In some embodiments the processes or methods may comprise at least one deposition cycle comprising contacting a surface of the substrate with a vapor phase silicon precursor that does not comprise nitrogen; contacting the adsorbed silicon species with at least one reactive species generated by plasma formed from a second reactant comprising hydrogen, wherein the second reactant does not comprise oxygen; and optionally repeating the contacting steps until a SiOC film of a desired thickness has been formed.

In some embodiments a ratio of a wet etch rate of the SiOC thin film to a wet etch rate of thermal silicon oxide is less than about 5. In some embodiments a ratio of a wet etch rate of the SiOC thin film to a wet etch rate of thermal silicon oxide is less than about 0.3. In some embodiments a ratio of a wet etch rate of the SiOC thin film to a wet etch rate of thermal silicon oxide is less than about 0.1. In some embodiments the SiOC thin film is deposited on a three-dimensional structure on the substrate. In some embodiments a wet etch rate ratio of a wet etch rate of SiOC formed on a top surface of the three-dimensional structure to a wet etch rate of the SiOC formed on a sidewall surface of the three-dimensional structure is about 1:1 in dilute HF.

In some embodiments the vapor phase silicon precursor does not comprise a halogen. In some embodiments the vapor phase silicon precursor comprises bis(triethoxysilyl)ethane (BTESE). In some embodiments the vapor phase silicon precursor comprises 3-methoxypropyltrimethoxysilane (MPTMS). In some embodiments the vapor phase silicon precursor comprises (3-mercaptopropyl)trimethoxysilane. In some embodiments the reactive species comprises hydrogen plasma, hydrogen atoms, hydrogen radicals, or hydrogen ions. In some embodiments the reactive species is generated from a second reactant comprising a noble gas. In some embodiments the second reactant comprises $H_2$. In some embodiments the reactive species is generated from a second reactant comprising less than about 20 atomic % nitrogen. In some embodiments the second reactant consists essentially of $H_2$.

In some embodiments the SiOC thin film comprises at least 20 at % oxygen. In some embodiments the SiOC thin film comprises at least 0.1 at % carbon. In some embodiments the SiOC thin film comprises at least 1 at % carbon. In some embodiments the SiOC thin film comprises at least 5 at % carbon. In some embodiments the SiOC thin film comprises less than about 10 at % nitrogen.

In some embodiments methods are provided for forming a silicon oxycarbide (SiOC) thin film on a substrate in a reaction space. In some embodiments such methods may comprise a plurality of deposition cycles, wherein at least one deposition cycle comprises alternately and sequentially contacting a surface of the substrate with a silicon precursor that does not comprise nitrogen and a second reactant comprising at least one reactive species comprising hydrogen. In some embodiments the deposition cycle is repeated two or more times to form the SiOC thin film.

In some embodiments the at least one reactive species is generated by plasma formed from a gas that does not comprise oxygen. In some embodiments the at least one reactive species is generated by plasma formed from a gas that does not comprise nitrogen. In some embodiments the silicon precursor has a general formula of $(R^{II}O)_3Si-R^I-Si(OR^{II})_3$, wherein $R^I$ and $R^{II}$ are independently selected $C_1$-$C_5$ alkyl ligands. In some embodiments the silicon precursor comprises BTESE. In some embodiments the silicon precursor has a general formula: $Si(OR^I)_{4-x}R^{II}_x$ wherein x is an integer from 0 to 3, $R^I$ is an independently selected $C_1$-$C_7$ alkyl ligand, and $R^{II}$ is an independently selected ligand consisting of carbon, and/or hydrogen, and/or oxygen. In some embodiments the silicon precursor comprises MPTMS. In some embodiments the silicon precursor has a general formula: $(R^IO)_{4-x}Si-(R^{II}-O-R^{III})_x$ wherein x is an integer from 0 to 3, $R^I$ and $R^{II}$ are each independently selected $C_1$-$C_7$ alkyl ligands, and $R^{III}$ is an independently selected ligand consisting of carbon, and/or hydrogen, and/or oxygen.

In some embodiments at least one deposition cycle is a PEALD cycle. In some embodiments a reactive species is generated by applying RF power of 5 Watts (W) to about 5000 W to the second reactant. In some embodiments the deposition cycle is carried out at a process temperature of about 100° C. to about 300° C. In some embodiments the deposition cycle is carried out at a process temperature of less than about 100° C. In some embodiments the substrate comprises an organic material.

In some embodiments methods are provided for forming a silicon oxycarbide (SiOC) thin film on a substrate in a reaction space. In some embodiments the methods may comprise contacting a surface of the substrate with a silicon precursor that does not comprise nitrogen; exposing the substrate to a purge gas and/or vacuum to remove excess silicon precursor and reaction byproducts, if any; contacting a surface of the substrate with a second reactant comprising hydrogen, wherein the second reactant comprises at least one reactive species generated by plasma; exposing the substrate to a purge gas and/or vacuum to remove excess second reactant and reaction byproducts, if any; and repeating the contacting steps until a SiOC thin film of desired thickness has been formed.

DETAILED DESCRIPTION

Figure 1:
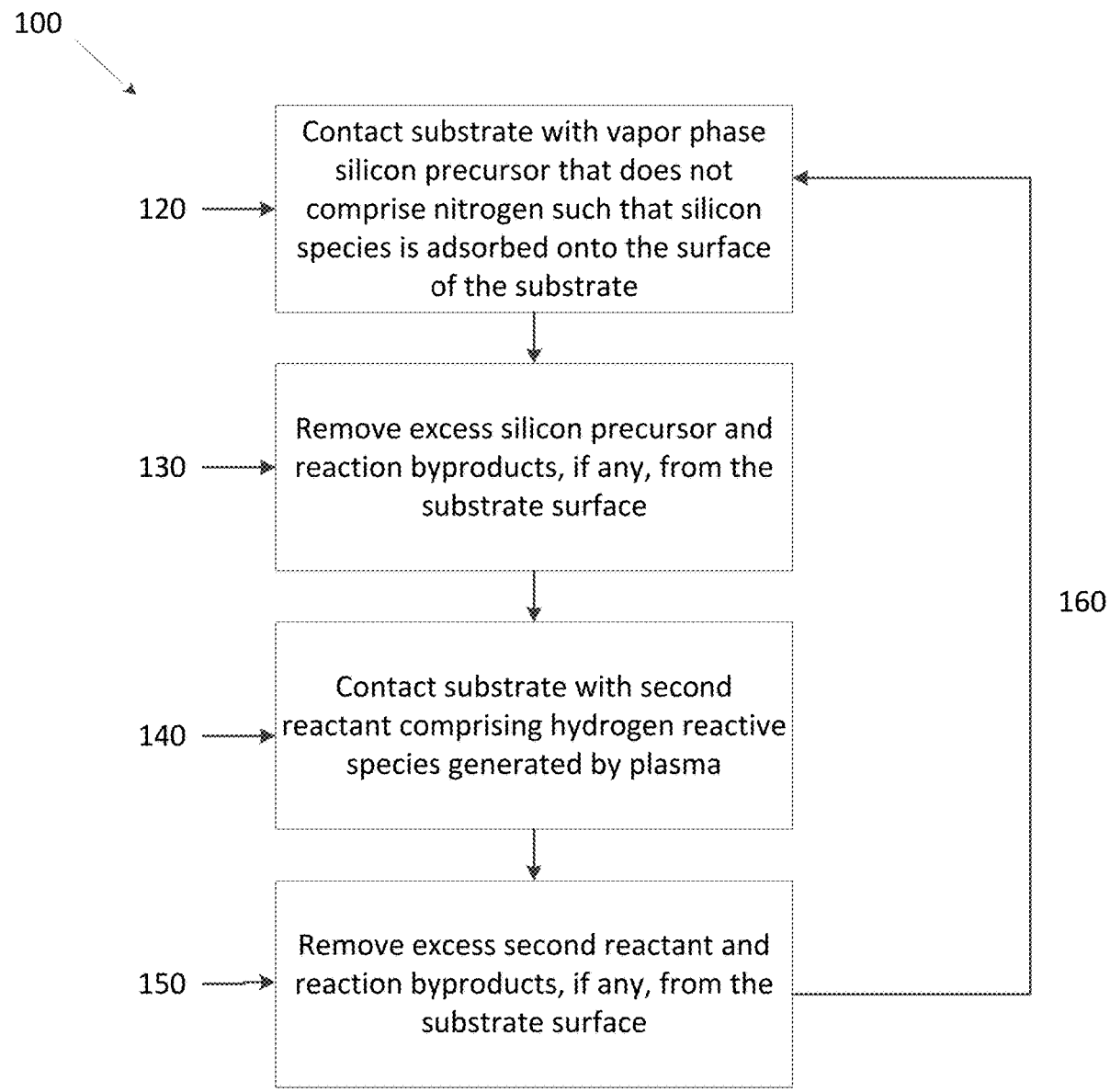
FIG. 1 is a process flow diagram for depositing a silicon oxycarbide (SiOC) thin film by a plasma enhanced atomic layer deposition (PEALD) process according to some embodiments of the present disclosure.

Silicon oxycarbide (SiOC) films have a wide variety of applications, as will be apparent to the skilled artisan, for example in integrated circuit fabrication. More specifically, SiOC films that display a low etch rate have a wide variety of application, both in the semiconductor industry and outside of the semiconductor industry. SiOC films may be useful as, for example, etch stop layers, sacrificial layers, low-k spacers, anti-reflection layers (ARL), and passivation layers.

According to some embodiments of the present disclosure, various SiOC films, precursors, and methods for depositing said films are provided. In some embodiments the SiOC films have a relatively low wet etch rate, for example in dHF.

In some embodiments SiOC thin films are deposited on a substrate by plasma-enhanced atomic layer deposition (PEALD) processes. In some embodiments SiOC thin films are not deposited by liquid phase methods. In some embodiments a SiOC thin film is deposited over a three dimensional structure, such as a fin in the formation of a finFET device.

The formula of the silicon oxycarbide films is generally referred to herein as SiOC for convenience and simplicity. As used herein, SiOC is not intended to limit, restrict, or define the bonding or chemical state, for example the oxidation state of any of Si, O, C, and/or any other element in the film. Further, in some embodiments SiOC thin films may comprise one or more elements in addition to Si, O, and/or C, such as S. In some embodiments the SiOC films may comprise Si—C bonds and/or Si—O bonds. In some embodiments the SiOC films may comprise Si—C bonds and Si—O bonds and may not comprise Si—N bonds. In some embodiments the SiOC films may comprise Si—S bonds in addition to Si—C and/or Si—O bonds. In some embodiments the SiOC films may comprise more Si—O bonds than Si—C bonds, for example a ratio of Si—O bonds to Si—C bonds may be from about 1:1 to about 10:1. In some embodiments the SiOC may comprise from about 0% to about 40% carbon on an atomic basis. In some embodiments the SiOC may comprise from about 0.1% to about 40%, from about 0.5% to about 30%, from about 1% to about 30%, or from about 5% to about 20% carbon on an atomic basis. In some embodiments the SiOC films may comprise from about 0% to about 70% oxygen on an atomic basis. In some embodiments the SiOC may comprise from about 10% to about 70%, from about 15% to about 50%, or from about 20% to about 40% oxygen on an atomic basis.

In some embodiments the SiOC films may comprise about 0% to about 50% silicon on an atomic basis. In some embodiments the SiOC may comprise from about 10% to about 50%, from about 15% to about 40%, or from about 20% to about 35% silicon on an atomic basis. In some embodiments the SiOC may comprise from about 0.1% to about 40%, from about 0.5% to about 30%, from about 1% to about 30%, or from about 5% to about 20% sulfur on an atomic basis. In some embodiments the SiOC films may not comprise nitrogen. In some other embodiments the SiOC films may comprise from about 0% to about 5% nitrogen on an atomic basis (at %).

ALD-type processes are based on controlled, generally self-limiting surface reactions. Gas phase reactions are typically avoided by contacting the substrate alternately and sequentially with the reactants. Vapor phase reactants are separated from each other in the reaction chamber, for example, by removing excess reactants and/or reactant byproducts between reactant pulses. The reactants may be removed from proximity with the substrate surface with the aid of a purge gas and/or vacuum. In some embodiments excess reactants and/or reactant byproducts are removed from the reaction space by purging, for example with an inert gas.

In some embodiments, plasma enhanced ALD (PEALD) processes are used to deposit SiOC films. In some embodiments PEALD processes as described herein do not use oxygen plasma. In some embodiments PEALD processes as described herein do not include a reactant comprising oxygen plasma. In some embodiments PEALD processes as described herein do not use nitrogen plasma. In some embodiments PEALD processes as described herein do not include a reactant comprising nitrogen plasma. In some embodiments PEALD processes as described herein may use hydrogen plasma. In some embodiments PEALD processes as described herein may include a reactant comprising hydrogen plasma. Briefly, a substrate or workpiece is placed in a reaction chamber and subjected to alternately repeated surface reactions. In some embodiments, thin SiOC films are formed by repetition of a self-limiting ALD cycle. In some embodiments, for forming SiOC films, each ALD cycle comprises at least two distinct phases. The contacting and removal of a reactant or precursor from the substrate may be considered a phase. In a first phase, a vapor phase first reactant or precursor comprising silicon contacts the substrate and forms no more than about one monolayer on the substrate surface. This reactant is also referred to herein as "the silicon precursor," "silicon-containing precursor," or "silicon reactant" and may be, for example, bis(triethoxysilyl)ethane (BTESE) or 3-methoxypropyltrimethoxysilane (MPTMS). In some embodiments excess first vapor phase reactant and any reaction byproducts are removed from the proximity of the substrate surface. The first vapor phase reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber.

In a second phase, a second reactant comprising a reactive species contacts the substrate and may convert adsorbed silicon species to SiOC. In some embodiments the second reactant comprises a hydrogen precursor. In some embodiments, the reactive species comprises an excited species. In some embodiments the second reactant comprises a species from a hydrogen containing plasma. In some embodiments, the second reactant comprises hydrogen radicals, hydrogen atoms and/or hydrogen plasma. The second reactant may comprise other species that are not hydrogen precursors. In some embodiments, the second reactant may comprise a species from a noble gas, such as one or more of He, Ne, Ar, Kr, or Xe, for example as radicals, in plasma form, or in elemental form. These reactive species from noble gases do not necessarily contribute material to the deposited film, but can in some circumstances contribute to film growth as well as help in the formation and ignition of plasma. In some embodiments the reactive species generated from noble gases may affect the amount or extent of any damage to the underlying substrate. A skilled artisan will be able to select a noble gas or gases suitable for a particular application. In some embodiments a gas that is used to form a plasma may flow constantly throughout the deposition process but only be activated intermittently. In some embodiments a gas that is used to form a plasma does not comprise oxygen. In some embodiments the adsorbed silicon precursor is not contacted with a reactive species generated by a plasma from oxygen. In some embodiments a second reactant comprising reactive species is generated in a gas that does not comprise oxygen. For example in some embodiments a second reactant may comprise a plasma generated in a gas that does not comprise oxygen. In some embodiments the second reactant may be generated in a gas comprising less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen.

In some embodiments a gas that is used to form a plasma does not comprise nitrogen. In some embodiments the adsorbed silicon precursor is not contacted with a reactive species generated by a plasma from nitrogen. In some embodiments a second reactant comprising reactive species is generated in a gas that does not comprise nitrogen. For example in some embodiments a second reactant may comprise a plasma generated in a gas that does not comprise nitrogen. However, in some embodiments a gas that is used to form a plasma may comprise nitrogen. In some other embodiments the second reactant may comprise nitrogen radicals, nitrogen atoms and/or nitrogen plasma. In some embodiments the second reactant may be generated in a gas comprising less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments the second reactant may be generated in a gas comprising hydrogen and nitrogen, for example the second reactant may comprise $H_2$ and $N_2$. In some embodiments the second reactant may be generated in a gas having a ratio of $N_2$ to $H_2$ ($N_2/H_2$) of less than about 20%, less than about 10%, or less than about 5%.

In some embodiments a gas that is used to form a plasma does not comprise nitrogen or oxygen. In some embodiments the adsorbed silicon precursor is not contacted with a reactive species generated by a plasma from nitrogen or oxygen. In some embodiments a second reactant comprising reactive species is generated in a gas that does not comprise nitrogen or oxygen. For example in some embodiments a second reactant may comprise a plasma generated in a gas that does not comprise nitrogen or oxygen.

In some embodiments excess second reactant and any reaction byproducts are removed from the proximity of the substrate surface. The second reactant and any reaction byproducts may be removed from proximity with the substrate surface with the aid of a purge gas and/or vacuum. In some embodiments excess reactant and/or reactant byproducts are removed from the reaction space by purging, for example with an inert gas. In some embodiments the substrate may be moved in order to facilitate removal of the reactant and/or reactant byproducts, for example by moving the substrate to a different reaction chamber Additional phases may be added and phases may be removed as desired to adjust the composition of the final film.

One or more of the reactants may be provided with the aid of a carrier gas, such as Ar or He. In some embodiments the silicon precursor and the second reactant are provided with the aid of a carrier gas.

In some embodiments, two of the phases may overlap, or be combined. For example, the silicon precursor and the second reactant may be contact the substrate simultaneously in phases that partially or completely overlap. In addition, although referred to as the first and second phases, and the first and second reactants, the order of the phases may be varied, and an ALD cycle may begin with any one of the phases. That is, unless specified otherwise, the reactants can contact the substrate in any order, and the process may begin with any of the reactants.

As discussed in more detail below, in some embodiments for depositing a SiOC film, one or more deposition cycles begin by contacting the substrate with the silicon precursor, followed by the second precursor. In other embodiments deposition may begin by contacting the substrate with the second precursor, followed by the silicon precursor.

In some embodiments the substrate on which deposition is desired, such as a semiconductor workpiece, is loaded into a reaction space or reactor. The reactor may be part of a cluster tool in which a variety of different processes in the formation of an integrated circuit are carried out. In some embodiments a flow-type reactor is utilized. In some embodiments a shower head type of reactor is utilized. In some embodiments, a space divided reactor is utilized. In some embodiments a high-volume manufacturing-capable single wafer ALD reactor is used. In other embodiments a batch reactor comprising multiple substrates is used. For embodiments in which batch ALD reactors are used, the number of substrates is in the range of 10 to 200, in the range of 50 to 150, or in the range of 100 to 130.

Examples of suitable reactors that may be used include commercially available equipment such as the F-120® reactor, F-450® reactor, Pulsar® reactors—such as the Pulsar® 2000 and the Pulsar® 3000-EmerALD® reactor and Advance® 400 Series reactors, available from ASM America, Inc of Phoenix, Ariz. and ASM Europe B.V., Almere, Netherlands. Other commercially available reactors include those from ASM Japan K.K (Tokyo, Japan) under the tradename Eagle® XP and XP8.

In some embodiments, if necessary, the exposed surfaces of the workpiece can be pretreated to provide reactive sites to react with the first phase of the ALD process. In some embodiments a separate pretreatment step is not required. In some embodiments the substrate is pretreated to provide a desired surface termination. In some embodiments the substrate is pretreated with plasma.

Excess reactant and reaction byproducts, if any, are removed from the vicinity of the substrate, and in particular from the substrate surface, between reactant contacting phases. In some embodiments excess reactant and reaction byproducts, if any, are removed from the substrate surface by, for example, purging the reaction chamber between reactant contacting phases, such as by purging with an inert gas. The flow rate and contacting time of each reactant is tunable, as is the removal step, allowing for control of the quality and various properties of the films.

As mentioned above, in some embodiments a gas is provided to the reaction chamber continuously during each deposition cycle, or during the entire ALD process, and reactive species are provided by generating a plasma in the gas, either in the reaction chamber or upstream of the reaction chamber. In some embodiments the gas does not comprise nitrogen. In some embodiments the gas may comprise noble gas, such as helium or argon. In some embodiments the gas is helium. In some embodiments the gas is argon. The flowing gas may also serve as a purge gas for the first and/or second reactant (or reactive species). For example, flowing argon may serve as a purge gas for a first silicon precursor and also serve as a second reactant (as a source of reactive species). In some embodiments, argon or helium may serve as a purge gas for a first precursor and a source of excited species for converting the silicon precursor to the SiOC film. In some embodiments the gas in which the plasma is generated does not comprise nitrogen and the adsorbed silicon precursor is not contacted with a reactive species generated by a plasma from nitrogen. In some embodiments the gas in which the plasma is generated does not comprise oxygen and the adsorbed silicon precursor is not contacted with a reactive species generated by a plasma from oxygen. In some embodiments the gas in which the plasma is generated does not comprise oxygen or nitrogen and the adsorbed silicon precursor is not contacted with a reactive species generated by a plasma from oxygen or nitrogen.

The cycle is repeated until a film of the desired thickness and composition is obtained. In some embodiments the deposition parameters, such as the precursor flow rate, contacting time, removal time, and/or reactants themselves, may be varied in one or more deposition cycles during the ALD process in order to obtain a film with the desired characteristics.

In some embodiments the surface of the substrate is contacted with a reactant. In some embodiments a pulse of reactant is provided to a reaction space containing the substrate. The term "pulse" may be understood to comprise feeding reactant into the reaction chamber for a predetermined amount of time. The term "pulse" does not restrict the length or duration of the pulse and a pulse can be any length of time. In some embodiments the substrate is moved to a reaction space containing a reactant. In some embodiments the substrate is subsequently moved from a reaction space containing a first reactant to a second, different reaction space containing the second reactant.

In some embodiments, the substrate is contacted with the silicon reactant first. After an initial surface termination, if necessary or desired, the substrate is contacted with a first silicon reactant. In some embodiments a first silicon reactant pulse is supplied to the workpiece. In accordance with some embodiments, the first reactant pulse comprises a carrier gas flow and a volatile silicon species, such as BTESE or MPTMS, that is reactive with the workpiece surfaces of interest. Accordingly, the silicon reactant adsorbs upon these workpiece surfaces. The first reactant pulse self-saturates the workpiece surfaces with silicon reactant species such that any excess constituents of the first reactant pulse do not further react with the molecular layer formed by this process.

The first silicon reactant pulse can be supplied in gaseous form. The silicon precursor gas is considered "volatile" for purposes of the present description if the species exhibits sufficient vapor pressure under the process conditions to transport the species to the workpiece in sufficient concentration to saturate exposed surfaces.

In some embodiments the silicon reactant contacts the surface from about 0.05 seconds to about 5.0 seconds, about 0.1 seconds to about 3 seconds or about 0.2 seconds to about 1.0 seconds. The optimum contacting time can be readily determined by the skilled artisan based on the particular circumstances.

After sufficient time for about a molecular layer to adsorb on the substrate surface, excess first silicon reactant, and reaction byproducts, if any, are removed from the substrate surface. In some embodiments removing excess reactant and reaction byproducts, if any, may comprise purging the reaction chamber. In some embodiments the reaction chamber may be purged by stopping the flow of the first reactant while continuing to flow a carrier gas or purge gas for a sufficient time to diffuse or purge excess reactants and reactant by-products, if any, from the reaction space. In some embodiments the excess first precursor is purged with the aid of inert gas, such as helium or argon, which is flowing throughout the ALD cycle. In some embodiments the substrate may be moved from the reaction space containing the first reactant to a second, different reaction space. In some embodiments, the first reactant is removed for about 0.1 seconds to about 10 seconds, about 0.3 seconds to about 5 seconds or about 0.3 seconds to about 1 second. Contacting and removal of the silicon reactant can be considered the first or silicon phase of the ALD cycle.

In the second phase, a second reactant comprising a reactive species, such as hydrogen plasma is provided to the workpiece. Hydrogen plasma may be formed by generating a plasma in hydrogen in the reaction chamber or upstream of the reaction chamber, for example by flowing the hydrogen ($H_2$) through a remote plasma generator.

In some embodiments, plasma is generated in flowing $H_2$ gas. In some embodiments $H_2$ is provided to the reaction chamber before the plasma is ignited or hydrogen atoms or radicals are formed. In some embodiments the $H_2$ is provided to the reaction chamber continuously and hydrogen containing plasma, atoms or radicals is created or supplied when needed.

Typically, the second reactant, for example comprising hydrogen plasma, contacts the substrate for about 0.1 seconds to about 10 seconds. In some embodiments the second reactant, such as hydrogen containing plasma, contacts the substrate for about 0.1 seconds to about 10 seconds, 0.5 seconds to about 5 seconds or 0.5 seconds to about 2.0 seconds. However, depending on the reactor type, substrate type and its surface area, the second reactant contacting time may be even higher than about 10 seconds. In some embodiments, contacting times can be on the order of minutes. The optimum contacting time can be readily determined by the skilled artisan based on the particular circumstances.

In some embodiments the second reactant is provided in two or more distinct pulses, without introducing another reactant in between any of the two or more pulses. For example, in some embodiments a plasma, such as a hydrogen containing plasma, is provided in two or more sequential pulses, without introducing a Si-precursor in between the sequential pulses. In some embodiments during provision of plasma two or more sequential plasma pulses are generated by providing a plasma discharge for a first period of time, extinguishing the plasma discharge for a second period of time, for example from about 0.1 seconds to about 10 seconds, from about 0.5 seconds to about 5 seconds or about 1.0 seconds to about 4.0 seconds, and exciting it again for a third period of time before introduction of another precursor or a removal step, such as before the Si-precursor or a purge step. Additional pulses of plasma can be introduced in the same way. In some embodiments a plasma is ignited for an equivalent period of time in each of the pulses.

In some embodiments plasma, for example hydrogen containing plasma may be generated by applying RF power of from about 5 W to about 5000 W, 10 W to about 2000 W, from about 50 W to about 1000 W, or from about 200 W to about 800 W. In some embodiments the RF power density may be from about 0.02 W/cm$^2$ to about 2.0 W/cm$^2$, or from about 0.05 W/cm$^2$ to about 1.5 W/cm$^2$. The RF power may be applied to second reactant that flows during the plasma contacting time, that flows continuously through the reaction chamber, and/or that flows through a remote plasma generator. Thus in some embodiments the plasma is generated in situ, while in other embodiments the plasma is generated remotely. In some embodiments a showerhead reactor is utilized and plasma is generated between a susceptor (on top of which the substrate is located) and a showerhead plate. In some embodiments the gap between the susceptor and showerhead plate is from about 0.1 cm to about 20 cm, from about 0.5 cm to about 5 cm, or from about 0.8 cm to about 3.0 cm.

After a time period sufficient to completely saturate and react the previously adsorbed molecular layer of silicon species with the plasma pulse, any excess reactant and reaction byproducts are removed from the substrate surface.

In some embodiments removing excess reactant and reaction byproducts, if any, may comprise purging the reaction chamber. In some embodiments the reaction chamber may be purged by stopping the flow of the second reactant while continuing to flow a carrier gas or purge gas for a sufficient time to diffuse or purge excess reactants and reactant by-products, if any, from the reaction space. In some embodiments the excess second precursor is purged with the aid of inert gas, such as helium or argon, which is flowing throughout the ALD cycle. In some embodiments the substrate may be moved from the reaction space containing the second reactant to a different reaction space. The removal may, in some embodiments, be from about 0.1 seconds to about 10 seconds, about 0.1 seconds to about 4 seconds or about 0.1 seconds to about 0.5 seconds. Together, the reactive species contacting and removal represent a second, reactive species phase in a SiOC atomic layer deposition cycle.

The two phases together represent one ALD cycle, which is repeated to form SiOC thin films of a desired thickness. While the ALD cycle is generally referred to herein as beginning with the silicon phase, it is contemplated that in other embodiments the cycle may begin with the reactive species phase. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first ALD cycle, in subsequent cycles the reactive species phase will effectively follow the silicon phase. In some embodiments one or more different ALD cycles are provided in the deposition process.

According to some embodiments of the present disclosure, PEALD reactions may be performed at temperatures ranging from about 25° C. to about 700° C., from about 50° C. to about 600° C., from about 100° C. to about 450° C., or from about 200° C. to about 400° C. In some embodiments, the optimum reactor temperature may be limited by the maximum allowed thermal budget. Therefore, in some embodiments the reaction temperature is from about 100° C. to about 300° C. In some applications, the maximum temperature is around about 200° C., and, therefore the PEALD process is run at that reaction temperature.

The substrate on which a thin film is deposited may comprise various types of materials. In some embodiments the substrate may comprise an integrated circuit workpiece. In some embodiments the substrate may comprise silicon. In some embodiments the substrate may comprise silicon oxide, for example, thermal oxide. In some embodiments the substrate may comprise a high-k dielectric material. In some embodiments the substrate may comprise carbon. For example the substrate may comprise an amorphous carbon layer, graphene, and/or carbon nanotubes.

In some embodiments the substrate may comprise a metal, including, but not limited to W, Cu, Ni, Co, and/or Al. In some embodiments the substrate may comprise a metal nitride, including, but not limited to TiN and/or TaN. In some embodiments the substrate may comprise a metal carbide, including, but not limited to TiC and/or TaC. In some embodiments the substrate may comprise a metal chalcogenide, including, but not limited to $MoS_2$, $Sb_2Te_3$, and/or GeTe. In some embodiments the substrate may comprise a material that would be oxidized by exposure to an oxygen plasma process, but not by a PEALD process as described herein.

In some embodiments a substrate used in the PEALD processes described herein may comprise an organic material. For example, the substrate may comprise an organic material such as a plastic, polymer, and/or photoresist. In some embodiments where the substrate comprises an organic material the reaction temperature of a PEALD process may be less than about 200° C. In some embodiments the reaction temperature may be less than about 150° C., less than about 100° C., less than about 75° C., or less than about 50° C.

In some embodiments where a substrate comprises an organic material the maximum process temperature may be as low as 100° C. In some embodiments where the substrate comprises an organic material, the absence of a plasma generated from oxygen may allow for deposition of a SiOC thin film on an organic material that may not otherwise degrade in a deposition process including plasma generated from oxygen.

According to some embodiments of the present disclosure, the pressure of the reaction chamber during processing is maintained at from about 0.01 Torr to about 50 Torr, or from about 0.1 Torr to about 10 Torr. In some embodiments the pressure of the reaction chamber is greater than about 6 Torr, or about 20 Torr. In some embodiments, a SiOC deposition process can be performed at a pressure of about 20 Torr to about 500 Torr, about 20 Torr to about 50 Torr, or about 20 Torr to about 30 Torr.

In some embodiments a SiOC deposition process can comprise a plurality of deposition cycles, wherein at least one deposition cycle is performed in an elevated pressure regime. For example, a deposition cycle of a PEALD process may comprise alternately and sequentially contacting the substrate with a silicon precursor and a second reactant under the elevated pressure. In some embodiments, one or more deposition cycles of the PEALD process can be performed at a process pressure of about 6 Torr to about 500

Torr, about 6 Torr to about 50 Torr, or about 6 Torr to about 100 Torr. In some embodiments, the one or more deposition cycles can be performed at a process pressure of greater than about 20 Torr, including about 20 Torr to about 500 Torr, about 30 Torr to about 500 Torr, about 40 Torr to about 500 Torr, or about 50 Torr to about 500 Torr. In some embodiments, the one or more deposition cycles can be performed at a process pressure of about 20 Torr to about 30 Torr, about 20 Torr to about 100 Torr, about 30 Torr to about 100 Torr, about 40 Torr to about 100 Torr or about 50 Torr to about 100 Torr.

PEALD of SiOC

As mentioned above, and discussed in more detail below, in some embodiments SiOC thin films can be deposited on a substrate in a reaction space by a plasma enhanced atomic deposition layer (PEALD) process. According to some embodiments, a SiOC thin film is deposited using a PEALD process on a substrate having three-dimensional features, such as in a FinFET application. In some embodiments a PEALD process as described herein may be used in a variety of applications. For example, a PEALD process as described herein may be used in the formation of hardmask layers, sacrificial layers, protective layers, or low-k spacers. A PEALD process as described herein may be used in, for example, memory device applications.

In some embodiments a SiOC thin film may be deposited by a PEALD process that does not include oxygen plasma, as described herein, on a substrate that is not able to withstand O plasma without damage, for example a substrate comprising an organic and/or photoresist material. In some embodiments a SiOC thin film may be deposited by a PEALD process wherein the silicon precursor and the second reactant do not comprise nitrogen.

Referring to FIG. 1 and according to some embodiments a SiOC thin film is deposited on a substrate in a reaction space by a PEALD deposition process 100 comprising at least one cycle comprising:
  contacting the substrate with a vapor phase silicon-containing precursor that does not comprise nitrogen at step 120 such that silicon species adsorb onto the surface of the substrate;
  removing excess silicon-containing precursor and reaction byproducts, if any, from the substrate surface at step 130;
  contacting the substrate with a second reactant comprising reactive species comprising hydrogen generated by plasma at step 140, thereby converting the adsorbed silicon species into SiOC;
  removing excess second reactant and reaction byproducts, if any, from the substrate surface at step 150; and
  optionally repeating the contacting and removing steps at step 160 to form a SiOC thin film of a desired thickness and composition.

In some embodiments step 140 may comprise remotely generating or forming plasma or reactive species before contacting the substrate with the second reactant.

According to some embodiments a SiOC plasma enhanced ALD deposition cycle can be used to deposit a SiOC thin film. In certain embodiments, a SiOC thin film is formed on a substrate by an ALD-type process comprising multiple SiOC deposition cycles, each SiOC deposition cycle comprising:
  contacting a substrate with a vapor phase silicon reactant that does not comprise nitrogen such that a silicon compound adsorbs on the substrate surface;
  exposing the substrate to a purge gas and/or vacuum;
  contacting the substrate with reactive species generated by forming a plasma in a second reactant comprising hydrogen; and
  exposing the substrate to a purge gas and/or vacuum;
  optionally repeating the contacting and exposing steps until a SiOC thin film of a desired thickness and composition is obtained.

In some embodiments the exposing the substrate to a purge gas and/or vacuum steps may comprise continuing the flow of an inert carrier gas while stopping the flow of a precursor or reactant. In some embodiments the exposing the substrate to a purge gas and/or vacuum steps may comprise stopping the flow of a precursor and a carrier gas into a reaction chamber and evacuating the reaction chamber, for example with a vacuum pump. In some embodiments the exposing the substrate to a purge gas and/or vacuum steps may comprise moving the substrate from a first reaction chamber to a second, different reaction chamber containing a purge gas. In some embodiments the exposing the substrate to a purge gas and/or vacuum steps may comprise moving the substrate from a first reaction chamber to a second, different reaction chamber under a vacuum. In some embodiments the reactive species may not comprise nitrogen.

According to some embodiments a SiOC thin film is deposited on a substrate in a reaction space by a PEALD deposition process comprising at least one cycle comprising:
  contacting the substrate with BTESE such that silicon species adsorb onto the surface of the substrate;
  removing excess BTESE and reaction byproducts, if any, from the substrate surface;
  contacting the substrate with a second reactant comprising reactive species generated by plasma, wherein the reactive species comprises hydrogen;
  removing excess second reactant and reaction byproducts, if any, from the substrate surface; and
  optionally repeating the contacting and removing steps to form a SiOC thin film of a desired thickness and composition.

In some embodiments contacting the substrate with a second reactant may comprise remotely generating or forming plasma or reactive species before contacting the substrate with the second reactant. In some embodiments the reactive species may not comprise nitrogen.

In certain embodiments, a SiOC thin film is formed on a substrate by an ALD-type process comprising multiple SiOC deposition cycles, each SiOC deposition cycle comprising: alternately and sequentially contacting the substrate with a first vapor phase silicon precursor that does not comprise nitrogen and a second reactant comprising reactive species. In some embodiments the silicon precursor may comprise BTESE and the second reactive species may comprise hydrogen. In some embodiments the second reactive species may not comprise nitrogen. In some embodiments the second reactive species may comprise relatively small amount of nitrogen as described above.

According to some embodiments a SiOC thin film is deposited on a substrate in a reaction space by a PEALD deposition process comprising at least one cycle comprising:
  contacting the substrate with MPTMS such that silicon species adsorb onto the surface of the substrate;
  removing excess MPTMS and reaction byproducts, if any, from the substrate surface;
  contacting the substrate with a second reactant comprising reactive species generated by plasma, wherein the reactive species comprises hydrogen;

removing excess second reactant and reaction byproducts, if any, from the substrate surface; and optionally repeating the contacting and removing steps to form a SiOC thin film of a desired thickness and composition.

In some embodiments contacting the substrate with a second reactant may comprise remotely generating or forming plasma or reactive species before contacting the substrate with the second reactant. In some embodiments the reactive species may not comprise nitrogen.

In certain embodiments, a SiOC thin film is formed on a substrate by an ALD-type process comprising multiple SiOC deposition cycles, each SiOC deposition cycle comprising: alternately and sequentially contacting the substrate with a first vapor phase silicon precursor that does not comprise nitrogen and a second reactant comprising reactive species. In some embodiments the silicon precursor may comprise BTESE and the second reactive species may comprise hydrogen. In some embodiments the second reactive species may not comprise nitrogen. In some embodiments the second reactive species may comprise relatively small amount of nitrogen as described above.

According to some embodiments a SiOC plasma enhanced ALD deposition cycle can be used to deposit a SiOC thin film. In certain embodiments, a SiOC thin film is formed on a substrate by an ALD-type process comprising multiple SiOC deposition cycles, each SiOC deposition cycle comprising:

contacting a substrate with a vapor phase silicon reactant that does not comprise nitrogen such that a silicon compound adsorbs on the substrate surface;

exposing the substrate to a purge gas and/or vacuum;

contacting the substrate with reactive species generated by forming a plasma in a second reactant comprising hydrogen that may also comprise nitrogen; and exposing the substrate to a purge gas and/or vacuum;

optionally repeating the contacting and exposing steps until a SiOC thin film of a desired thickness and composition is obtained.

In certain embodiments, a SiOC thin film is formed on a substrate by an ALD-type process comprising multiple SiOC deposition cycles, each SiOC deposition cycle comprising: alternately and sequentially contacting the substrate with a first vapor phase silicon precursor that does not comprise nitrogen and a second reactant comprising reactive species.

In some embodiments, the PEALD process is performed at a temperature between about 100° C. to about 650° C., about 100° C. to about 550° C., about 100° C. to about 450° C., about 200° C. to about 600° C., or at about 200° C. to about 400° C. In some embodiments the temperature is about 300° C. In some embodiments the temperature is about 200° C. In some embodiments, for example where a substrate comprises an organic material such as an organic photoresist, the PEALD process may be performed at a temperature less than about 100° C. In some embodiments the PEALD process is performed at a temperature less than about 75° C., or less than about 50° C. In some embodiments a plasma may be generated by applying RF power to the second reactant. The RF power may be applied to second reactant to thereby generate reactive species. In some embodiments the RF power may be applied to the second reactant that flows continuously through the reaction chamber, and/or that flows through a remote plasma generator. Thus in some embodiments the plasma is generated in situ, while in other embodiments the plasma is generated remotely. In some embodiments the RF power applied to the second reactant is from about 5 W to about 5000 W, 10 W to about 2000 W, from about 100 W to about 1000 W or from about 200 W to about 800 W. In some embodiments the RF power applied to the second reactant is about 200 W. In some embodiments the RF power applied to the second reactant is about 400 W. In some embodiments the RF power applied to the second reactant is about 800 W.

As discussed in more detail below, in some embodiments for depositing a SiOC film, one or more PEALD deposition cycles begin with provision of the silicon precursor, followed by the second reactant. In other embodiments deposition may begin with provision of the second reactant, followed by the silicon precursor. One of skill in the art will recognize that the first precursor phase generally reacts with the termination left by the last phase in the previous cycle. Thus, while no reactant may be previously adsorbed on the substrate surface or present in the reaction space if the reactive species phase is the first phase in the first PEALD cycle, in subsequent PEALD cycles the reactive species phase will effectively follow the silicon phase. In some embodiments one or more different PEALD sub-cycles are provided in the process for forming a SiOC thin film.

Si Precursors

A number of different suitable Si precursors can be used in the presently disclosed PEALD processes. In some embodiments the suitable Si precursors may not comprise nitrogen. In some embodiments a suitable Si precursor may comprise a silane.

In some embodiments a suitable Si precursor may comprise two Si atoms connected by, or bonded to, at least one hydrocarbon group. In some embodiments a suitable Si precursor may comprise two Si atoms connected by, or bonded to, at least one alkyl group. In some embodiments a suitable Si precursor may comprise two Si atoms connected by, or bonded to, at least one alkoxy group. In some embodiments a suitable Si precursor may comprise two Si atoms connected by, or bonded to, at least one silyl group. In some embodiments a suitable Si precursor may comprise two Si atoms connected by, or bonded to, at least one silyl ether group. In some embodiments a suitable Si precursor may comprise at least one —SH group, wherein the —SH may be bonded to an alkyl chain or a silicon atom. In some embodiments a suitable Si precursor may comprise at least one mercapto group. In some embodiments a suitable Si precursor may comprise at least one —R—SH structure, wherein R may be a $C_1$-$C_5$ alkyl group. In some embodiments a suitable Si precursor may comprise at least one —SH group on an alkyl chain and one or more alkoxy groups bonded to a silicon atom.

In some embodiments a suitable Si precursor may comprise at least one Si atom attached or bonded to one or more alkoxy groups. In some embodiments a suitable Si precursor may comprise at least one Si atom attached or bonded to one or more alkyl groups. In some embodiments a suitable Si precursor may comprise at least one Si atom attached or bonded to at least an alkyl group and an alkoxy group.

In some embodiments, at least some Si precursors suitable for deposition of SiOC by PEALD processes may comprise bridged alkoxysilanes having the following general formula:

$$(R^{II}O)_3Si-R^I-Si(OR^{II})_3 \quad (1)$$

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise bridged alkoxyalkylsilanes having the following general formula:

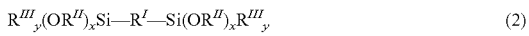

$$R^{III}{}_y(OR^{II})_xSi-R^I-Si(OR^{II})_xR^{III}{}_y \qquad (2)$$

Wherein each of $R^I$, $R^{II}$, and $R^{III}$ may be independently selected alkyl groups, and x+y=3. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise cyclic alkoxysilanes having the following general formula:

$$(R^{II}O)_2Si-R^I{}_2-Si(OR^{II})_2 \qquad (3)$$

Formula (3) may alternately be represented by the structural formula:

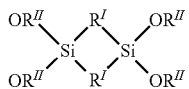

Wherein each of $R^I$ and $R^{II}$ may be independently selected alkyl groups. In some embodiments each of $R^I$ and $R^{II}$ are independently selected $C_1$-$C_5$ alkyl ligands, such as methyl, ethyl, n-propyl, isopropyl, tertbutyl, or pentyl.

According to some embodiments, some Si precursors may comprise cyclic alkoxyalkylsilanes having the following general formula:

$$R^{III}{}_y(OR^{II})_xSi-R^I{}_2-Si(OR^{II})_xR^{III}{}_y \qquad (4)$$

Formula (4) may alternately be represented by the structural formula:

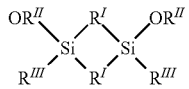

Wherein each of $R^I$, $R^{II}$, and $R^{III}$ may be independently selected alkyl groups, and x+y=2. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise linear alkoxysilanes having the following general formula:

$$(R^{II}O)_3Si-(O-Si-R^I{}_2)_n-O-Si(OR^{II})_3 \qquad (5)$$

Wherein $R^I$ may be an independently selected alkyl group or hydrogen, $R^{II}$ may be an independently selected alkyl group, and n=1-4. In some embodiments each of $R^I$ and $R^{II}$ are independently selected $C_1$-$C_5$ alkyl ligands, such as methyl, ethyl, n-propyl, isopropyl, tertbutyl, or pentyl. In some embodiments $R^I$ may be hydrogen and $R^{II}$ may be an independently selected $C_1$-$C_5$ alkyl ligand.

According to some embodiments, some Si precursors may comprise linear alkoxysilanes having the following general formula:

$$R^{III}{}_y(OR^{II})_xSi-(-R^I-Si)_n-Si(OR^{II})_xR^{III}{}_y \qquad (6)$$

Wherein each of $R^I$, $R^{II}$, and $R^{III}$ may be independently selected alkyl groups, x+y=2, and n can be greater than or equal to 1. In some embodiments $R^I$ and $R^{II}$ are independently selected $C_1$-$C_5$ alkyl ligands, such as methyl, ethyl, n-propyl, isopropyl, tertbutyl, or pentyl. In some embodiments $R^{III}$ may be an independently selected $C_1$-$C_8$ alkyl ligand.

According to some embodiments, some Si precursors may comprise alkoxysilanes having the following general formula:

$$Si(OR^I)_4 \qquad (7)$$

Wherein $R^I$ may be an independently selected alkyl group. In some embodiments $R^I$ may be an independently selected $C_1$-$C_5$ alkyl ligand, such as methyl, ethyl, n-propyl, isopropyl, tertbutyl, or pentyl.

According to some embodiments, some Si precursors may comprise alkoxyalkylsilanes having the following general formula:

$$Si(OR^I)_4 \qquad (8)$$

Wherein each of $R^I$ and $R^{II}$ may be independently selected alkyl groups, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may be an independently selected $C_1$-$C_8$ alkyl ligand.

According to some embodiments, some Si precursors may comprise alkoxysilanes that do not comprise nitrogen and have the following general formula:

$$Si(OR^I)_{4-x}R^{II}{}_x \qquad (9)$$

Wherein $R^I$ may be an independently selected alkyl group, $R^{II}$ may be any ligand comprising carbon, hydrogen, and/or oxygen that does not comprise nitrogen, and x=1-3. In some embodiments $R^I$ may be an independently selected $C_1$-$C_5$ alkyl ligand, such as methyl, ethyl, n-propyl, isopropyl, tertbutyl, or pentyl. In some embodiments $R^{II}$ may comprise, for example an alkenyl, alkynyl, phenyl, carbonyl, aldehyde, ester, ether, carboxyl, peroxy, hydroperoxy, thiol, acrylate, or methacrylate ligand.

According to some embodiments, some Si precursors may the following general formula:

$$Si(OR^I)_{4-x}R^{II}{}_x \qquad (10)$$

Wherein x=0-3, $R^I$ may be an independently selected $C_1$-$C_7$ or $C_1$-$C_5$ alkyl ligand, and $R^{II}$ may be an independently selected ligand consisting of carbon, and/or hydrogen, and/or oxygen. For example, in some embodiments $R^{II}$ can be an alkoxyalkyl group. In some embodiments $R^{II}$ can be, for example, an alkenyl, alkynyl, phenyl, carbonyl, aldehyde, ester, ether, carboxyl, peroxy, or hydroperoxy group. In some embodiments, for example, $R^I$ is a methyl group, $R^{II}$ is a 3-methoxypropyl ligand, and x is 1.

According to some embodiments, some Si precursors may have the following general formula:

$$(R^IO)_{4-x}Si-(R^{II}-O-R^{III})_x \qquad (11)$$

Wherein x=0-3, each of $R^I$ and $R^{II}$ may be an independently selected $C_1$-$C_7$ or $C_1$-$C_5$ alkyl ligand, and $R^{III}$ may be an independently selected ligand consisting of carbon, and/or hydrogen, and/or oxygen. For example, in some embodiments $R^{III}$ can be, for example, an alkenyl, alkynyl, phenyl, carbonyl, aldehyde, ester, ether, carboxyl, peroxy, or hydroperoxy group. In some embodiments, for example, $R^I$, $R^{II}$, and $R^{III}$ can each be a group independently selected from methyl, ethyl, i-propyl, n-propyl, n-butyl, i-butyl, and t-butyl.

Figure 2:
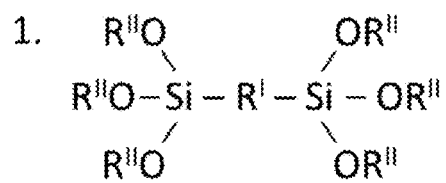
FIG. 2 illustrates the molecular structures of exemplary silicon precursors according to some embodiments.
Figure 2:
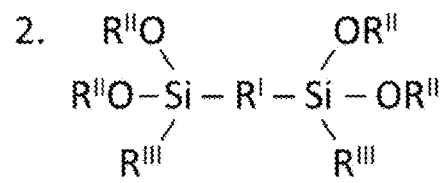
Figure 2:
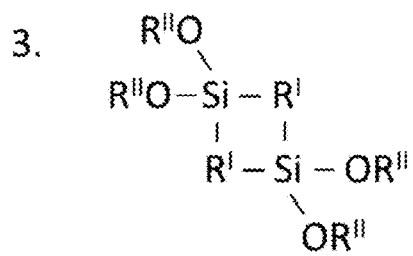
Figure 2:
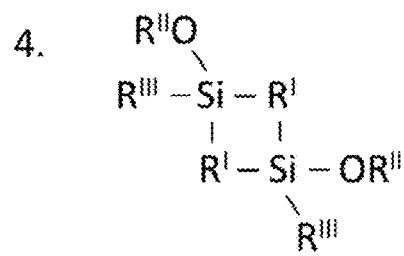
Figure 2:
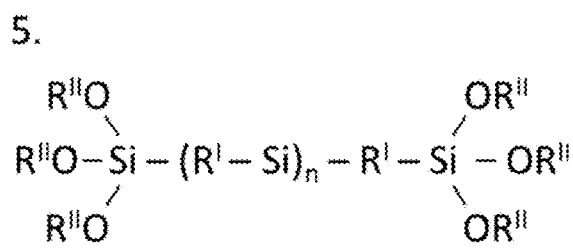
Figure 2:
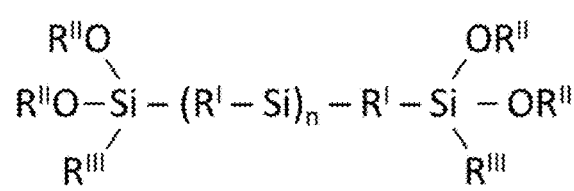
Figure 2:
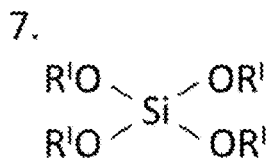
Figure 2:
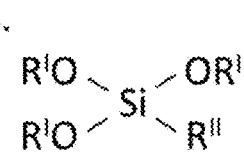
Figure 2:
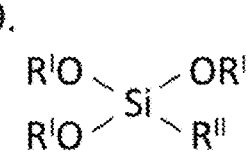
Figure 2:
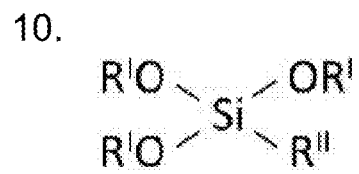
Figure 2:
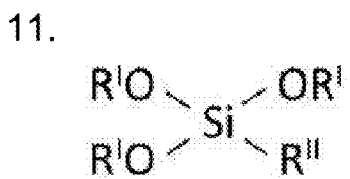

According to some embodiments, some Si precursors may have the following general formula:

$$Si(R^I)_{4-x-y}R^{II}{}_xR^{III}{}_y \qquad (12)$$

Wherein x+y=0-4, $R^I$ is an alkoxide ligand having from 1 to 5 carbon atoms, or a halide, $R^{II}$ is any ligand comprising sulfur, and $R^{III}$ consists of one of a sulfhydryl, sulfide, disulfide, sulfinyl, sulfonyl, sulfino, sulfo, thiocyanate, isothiocyanate, or carbonothioyl functionality. In some embodiments $R^I$, $R^{II}$, and $R^{III}$ may each be independently selected. In some embodiments $R^I$ may comprise a methoxy ligand, $R^{III}$ may comprise 3-mercaptopropyl, x=1, and y=0. That is, in some embodiments some an Si precursor may comprise $Si(OCH_3)_3C_3H_6SH$. In some embodiments a Si precursor may comprise mercaptomethylmethyldiethoxysilane, 3-mercaptopropylmethyldimethoxysilane and/or 3-mercaptopropyltriethoxysilane In some embodiments the silicon precursor does not comprise a halogen. In some embodiments the silicon precursor does not comprise nitrogen. In some embodiments the carbon chain may be unsaturated and contain double carbon-carbon bonds. In some other embodiments the carbon chain may contain other atoms than carbon and hydrogen. According to some embodiments suitable silicon precursors can include at least compounds having any of the general formulas (1) through (11). FIG. 2 illustrates exemplary molecular structures for suitable Si precursors according to formulas (1)-(11) described above. In some embodiments the silicon precursor can comprise bis(triethoxysilyl) ethane (BTESE). In some embodiments the silicon precursor can comprise 3-methoxypropyltrimethoxysilane (MPTMS or $Si(OCH_3)_3C_3H_6OCH_3$). In some embodiments the silicon precursor can comprise (3-mercaptopropyl)trimethoxysilane.

In some embodiments more than one silicon precursor may contact the substrate surface at the same time during an ALD phase. In some embodiments the silicon precursor may comprise more than one of the silicon precursors described herein. In some embodiments a first silicon precursor is used in a first ALD cycle and a second, different ALD precursor is used in a later ALD cycle. In some embodiments multiple silicon precursors may be used during a single ALD phase, for example in order to optimize certain properties of the deposited SiOC film. In some embodiments only one silicon precursor may contact the substrate during the deposition. In some embodiments there may only be one silicon precursor and one second reactant or composition of second reactants in the deposition process. In some embodiments there is no metal precursor in the deposition process. In some embodiments the silicon precursor is not used as a silylating agent. In some embodiments the deposition temperature and/or the duration of the silicon precursor contacting step are selected such that the silicon precursor does not decompose. In some embodiments the silicon precursor may decompose during the silicon precursor contacting step. In some embodiments the silicon precursor does not comprise a halogen, such as chlorine or fluorine.

Second Reactants

As discussed above, the second reactant for depositing SiOC according to the present disclosure may comprise a hydrogen precursor, which may comprise a reactive species. In some embodiments a reactive species includes, but is not limited to, radicals, plasmas, and/or excited atoms or species. Such reactive species may be generated by, for example, plasma discharge, hot-wire, or other suitable methods. In some embodiments the reactive species may be generated remotely from the reaction chamber, for example upstream from the reaction chamber ("remote plasma"). In some embodiments the reactive species may be generated in the reaction chamber, in the direct vicinity of the substrate, or directly above the substrate ("direct plasma").

Suitable plasma compositions of a PEALD process include hydrogen reactive species, that is, plasma, radicals of hydrogen, or atomic hydrogen in one form or another. In some embodiments a second reactant may comprise a reactive species formed at least in part from $H_2$. In some embodiments, a plasma may also contain noble gases, such as He, Ne, Ar, Kr and Xe, or Ar or He, in plasma form, as radicals, or in atomic form.

In some embodiments the second reactant may comprise reactive species formed from $H_2$. In some embodiments the second reactant may be generated from a gas containing more than about 25 atomic % (at %) hydrogen, more than about 50 at % hydrogen, more than about 75 at % hydrogen, more than about 85 at % hydrogen, more than about 90 at % hydrogen, more than about 95 at % hydrogen, more than about 96 at %, 97 at %, 98 at %, or more than about 99 at % hydrogen.

In some embodiments the gas used to generate reactive species, such as plasma, may consist essentially of hydrogen. Thus, in some embodiments the second reactant may consist essentially of hydrogen plasma, radicals of hydrogen, or atomic hydrogen. In some embodiments the second reactant may comprise more than about 25 at % hydrogen, more than about 50 at % hydrogen, 75 at %, more than about 85 at %, more than about 90 at %, more than about 95 at %, more than about 96 at %, 97 at %, 98 at %, or more than about 99 at % hydrogen plasma, radicals of hydrogen, or atomic hydrogen. In some embodiments the second reactant may be formed, at least in part, from $H_2$ and one or more other gases, where the $H_2$ and other gas or gases are provided at a flow ratio ($H_2$/other gas or gases), from about 1:1000 to about 1000:1 or greater. In some embodiments the flow ratio ($H_2$/other gas or gases) may be greater than about 1:1000, greater than about 1:100, greater than about 1:50, greater than about 1:20, greater than about 1:10, greater than about 1:6, greater than about 1:3, greater than about 1:1, greater than about 3:1, greater than about 6:1, greater than about 10:1, greater than about 20:1, 50:1, 100:1, or 1000:1 or greater.

In some embodiments, the second reactant does not comprise any species generated from oxygen. Thus, in some embodiments reactive species are not generated from a gas containing oxygen. In some embodiments a second reactant comprising reactive species is generated from a gas that does not contain oxygen. For example in some embodiments a second reactant may comprise a plasma generated from a gas that does not contain oxygen. In some other embodiments the second reactant may be generated from a gas containing less than about 50 atomic % (at %) oxygen, less than about 30 at % oxygen, less than about 10 at % oxygen, less than about 5 at % oxygen, less than about 1 at % oxygen, less than about 0.1 at % oxygen, less than about 0.01 at % oxygen, or less than about 0.001 at % oxygen. In some embodiments a second reactant does not comprise 02, $H_2O$ or 03.

In some embodiments, a hydrogen plasma may be free or substantially free of oxygen-containing species (e.g., oxygen ions, radicals, atomic oxygen). For example, oxygen-containing gas is not used to generate the hydrogen plasma. In some embodiments, oxygen-containing gas (e.g., 02 gas) is not flowed into the reaction chamber during the hydrogen plasma step.

In some embodiments oxygen-containing gas is not used to generate the hydrogen plasma. In some embodiments, oxygen-containing gas (e.g., 02 gas) is not flowed into the reaction chamber during the hydrogen plasma step.

In some embodiments, the second reactant does not comprise any species generated from nitrogen. Thus, in some embodiments reactive species are not generated from a gas containing nitrogen. In some embodiments a second reactant comprising reactive species is generated from a gas that does not contain nitrogen. For example in some embodiments a second reactant may comprise a plasma generated from a gas that does not contain nitrogen. In some embodiments the second reactant may be generated from a gas containing less than about 25 atomic % (at %) nitrogen, less than about 20 at % nitrogen, less than about 15 at % nitrogen, less than about 10 at % nitrogen, less than about 5 at % nitrogen, less than about 1 at % nitrogen, less than about 0.1 at % nitrogen, less than about 0.01 at % nitrogen, or less than about 0.001 at % nitrogen. In some embodiments a second reactant does not comprise $N_2$, $NH_3$ or $N_2H_4$.

In some embodiments, a hydrogen plasma may be free or substantially free of nitrogen-containing species (e.g., nitrogen ions, radicals, atomic nitrogen). For example, nitrogen-containing gas is not used to generate the hydrogen plasma. In some embodiments, nitrogen-containing gas (e.g., $N_2$ gas) is not flowed into the reaction chamber during the hydrogen plasma step.

However, in some other embodiments, nitrogen reactive species in the form of plasma, radicals of nitrogen, or atomic nitrogen in one form or another are also provided. Thus, in some embodiments the second reactant may comprise reactive species formed from compounds having both N and H, such as $NH_3$ and $N_2H_4$, a mixture of $N_2/H_2$ or other precursors having an N—H bond. In some embodiments the second reactant may be formed, at least in part, from $N_2$. In some embodiments the second reactant may be formed, at least in part, from $H_2$ and $N_2$, where the $H_2$ and $N_2$ are provided at a flow ratio ($H_2/N_2$), from about 100:1 to about 1:100, from about 20:1 to about 1:20, from about 10:1 to about 1:10, from about 5:1 to about 1:5 and/or from about 2:1 to about 4:1, and in some cases 1:1. For example, a hydrogen-containing plasma for depositing SiOC can be generated using both $N_2$ and $H_2$ at one or more ratios described herein.

In some embodiments the gas used to generated reactive species, such as plasma, may consist essentially of argon or another noble gas. In some embodiments, a plasma power used for generating a hydrogen-containing plasma can be about 5 Watts (W) to about 5000 W, 10 W to about 2,000 W, about 50 W to about 1000 W, about 100 W to about 1000 W or about 100 W to about 500 W. In some embodiments, a plasma power used for generating a hydrogen-containing plasma can be about 100 W to about 300 W. In some embodiments, hydrogen containing plasma may also comprise argon or another noble gas.

SiOC Film Characteristics

SiOC thin films deposited according to some of the embodiments discussed herein may achieve impurity levels or concentrations below about 3 at %, below about 1 at %, below about 0.5 at %, or below about 0.1 at %. In some thin films, the total impurity level excluding hydrogen may be below about 5 at %, below about 2 at %, below about 1 at %, or below about 0.2 at %. And in some thin films, hydrogen levels may be below about 30 at %, below about 20 at %, below about 15 at %, or below about 10 at %. As used herein, an impurity may be considered any element other than Si, O, and/or C. In some embodiments the thin films do not comprise argon.

In some embodiments, the deposited SiOC films do not comprise an appreciable amount of hydrogen. However, in some embodiments a SiOC film comprising hydrogen is deposited. In some embodiments, the deposited SiOC films comprises less than about 30 at %, less than about 20 at %, less than about 15 at %, less than about 10 at % or less than about 5 at % of hydrogen. In some embodiments the thin films do not comprise argon.

According to some embodiments, the SiOC thin films may exhibit step coverage and pattern loading effects of greater than about 50%, greater than about 80%, greater than about 90%, or greater than about 95%. In some cases step coverage and pattern loading effects can be greater than about 98% and in some case about 100% (within the accuracy of the measurement tool or method). In some embodiments step coverage and pattern loading effects can be greater than about 100%, greater than about 110%, greater than about 120%, greater than about 130%, or greater than about 140%. These values can be achieved in features with aspect ratios of 2 or greater, in some embodiments in aspect ratios of about 3 or greater, in some embodiments in aspect ratios of about 5 or greater and in some embodiments in aspect ratios of about 8 or greater.

In some embodiments the step coverage may be between about 50% and about 110%, between about between about 80% and about 110%, between about 90% and about 110%, between about 95% and about 110%, between about 98% and 110%, or between about 100% and 110%. In some embodiments the step coverage may be between about 50% and about 100%, between about between about 80% and about 100%, between about 90% and about 100%, between about 95% and 100%, or between about 98% and 100%.

In some embodiments the growth rate of the film is from about 0.01 Å/cycle to about 5 Å/cycle, from about 0.05 Å/cycle to about 2 Å/cycle. In some embodiments the growth rate of the film is more than about 0.05 Å/cycle, more than about 0.1 Å/cycle, more than about 0.15 Å/cycle, more than about 0.3 Å/cycle, more than about 0.3 Å/cycle, more than about 0.4 Å/cycle. As used herein, "pattern loading effect" is used in accordance with its ordinary meaning in this field. While pattern loading effects may be seen with respect to impurity content, density, electrical properties and etch rate, unless indicated otherwise the term pattern loading effect when used herein refers to the variation in film thickness in an area of the substrate where structures are present. Thus, the pattern loading effect can be given as the film thickness in the sidewall or bottom of a feature inside a three-dimensional structure relative to the film thickness on the sidewall or bottom of the three-dimensional structure/feature facing the open field. As used herein, a 100% pattern loading effect (or a ratio of 1) would represent about a completely uniform film property throughout the substrate regardless of features i.e. in other words there is no pattern loading effect (variance in a particular film property, such as thickness, in features vs. open field).

In some embodiments, SiOC films are deposited to a thickness of from about 3 nm to about 50 nm, from about 5 nm to about 30 nm, from about 5 nm to about 20 nm. These thicknesses can be achieved in feature sizes (width) below about 100 nm, about 50 nm, below about 30 nm, below about 20 nm, and in some cases below about 15 nm. According to some embodiments, a SiOC film is deposited on a three-dimensional structure and the thickness at a sidewall may be slightly even more than 10 nm. In some embodiments SiOC films of greater than 50 nm can be deposited. In some embodiments SiOC films of greater than 100 nm can be deposited. In some embodiments, SiOC films are deposited to a thickness of more than about 1 nm, more than about 2 nm, more than about 3 nm, more than about 5 nm, more than about 10 nm.

According to some embodiments SiOC films with various wet etch rates (WER) may be deposited. When using a blanket WER in 0.5 wt % dHF (nm/min), SiOC films may have WER values of less than about 5, less than about 4, less than about 2, or less than about 1. In some embodiments SiOC films may have WER values significantly less than 1. In some embodiments SiOC films may have WER values less than about 0.3, less than about 0.2, or less than about 0.1. In some embodiments SiOC films may have WER values less than about 0.05, less than about 0.025, or less than about 0.02.

The blanket WER in 0.5 wt % dHF (nm/min) relative to the WER of thermal oxide (WERR) may be less than about 3, less than about 2, less than about 1, or less than about 0.5. In some embodiments the blanket WER in 0.5 wt % dHF relative to the WER of TOX may be less than about 0.1.

In some embodiments wherein a PEALD process is carried out at temperatures less than about 100° C., The blanket WER in 0.5 wt % dHF (nm/min) relative to the WER of thermal oxide may be less than about 10, less than about 5, less than about 3, and less than about 2, or less than about 1.

And in some embodiments, a ratio of a sidewall etch rate, for example a WER of a SiOC film deposited on a substantially vertical three dimensional feature, such as a fin or trench relative to the etch rate of the SiOC film deposited on a substantially horizontal surface, such as the top surface of a three dimensional feature, such as fin or trench, in 0.5 wt % dHF may be from about 1 to about 2, from about 2 to about 5, from about 5 to about 10, from about 10 to about 20, or in some cases greater than or equal to about 20. In some embodiments a ratio of the WER of a SiOC film deposited on a vertical surface of a three dimensional feature to the WER of a SiOC film deposited on the top surface of a three dimensional feature may be equal to or greater than about 2, equal to or greater than about 5, equal to or greater than about 10, equal to or greater than about 15, or equal to or greater than about 20.

In some embodiments a ratio of the WER of a SiOC film deposited on or in a substantially vertical surface of a three dimensional feature, for example a sidewall surface, to the WER of a SiOC film deposited on or in a substantially horizontal surface of a three dimensional feature, for example a top surface, may be from about 1 to about 0.5, from about 0.5 to about 0.2, from about 0.2 to about 0.1, from about 0.1 to about 0.05, or in some cases less than about 0.05. In some embodiments a ratio of the WER of a SiOC film deposited on a substantially vertical surface of a three dimensional feature to the WER of a SiOC film deposited on a substantially horizontal surface of a three dimensional feature may be equal to or less than about 0.5, equal to or less than about 0.2, equal to or less than about 0.1, or equal to or less than about 0.05.

In some embodiments a ratio of the WER of a SiOC film deposited on or in a substantially vertical surface of a three dimensional feature, for example a sidewall surface, to a WER of TOX may be between about 5 to about 10, between about 2 to about 5, between about 1 to about 2, between about 0.5 to about 1, or between about 0.1 to about 0.5. In some embodiments a ratio of the WER of a SiOC film deposited on or in a substantially vertical surface of a three dimensional feature, for example a sidewall surface to a WER of TOX may be greater than or equal to about 0.1, greater than or equal to about 0.5, greater than or equal to about 1, greater than or equal to about 2, greater than or equal to about 5, or greater than or equal to about 10.

In some embodiments, SiOC formed according to one or more processes described herein can advantageously demonstrate a ratio of a WER of a substantially vertical region to a WER of a substantially horizontal region of about 1, for example in 0.5 wt % dHF. For example, a ratio of a wet etch rate of a SiOC thin film formed over substantially vertical surfaces (e.g., sidewall surfaces) to a wet etch rate of the SiOC thin film formed over substantially horizontal surfaces (e.g., top surfaces) of three-dimensional structures on a substrate surface can be the same or substantially the same. In some embodiments, the ratio can be about 4 to about 0.5, about 2 to about 0.75, about 1.25 to about 0.8, or about 1.1 to about 0.9. These ratios can be achieved in features with aspect ratios of about 2 or more, about 3 or more, about 5 or more or even about 8 or more.

In some embodiments, SiOC formed according to one or more processes described herein can advantageously demonstrate a horizontal region to vertical region WERR of about 1, for example in 0.5 wt % dHF. For example, a ratio of a wet etch rate of SiOC thin film formed over horizontal surfaces (e.g., top surfaces) to a wet etch rate of the SiOC thin film formed over vertical surfaces (e.g., sidewall surfaces) of three-dimensional structures on a substrate surface can be the same or substantially the same. In some embodiments, the ratio can be about 0.25 to about 2, about 0.5 to about 1.5, about 0.75 to about 1.25, or about 0.9 to about 1.1. These ratios can be achieved in features with aspect ratios of about 2 or more, about 3 or more, about 5 or more or even about 8 or more.

In some embodiments, the amount of etching of SiOC films according to the present disclosure may be about 1, 2, 5, 10 or more times less than an amount of etching observed for thermal $SiO_2$ (TOX) in a 0.5 wt % HF-dip process (for example in a process in which about 2 to about 3 nm TOX is removed, 1, 2, 5, 10 or more times less SiOC is removed when deposited according to the methods disclosed herein).

In some embodiments less than about 2 nm of SiOC film may be removed in a 0.5 wt % HF-dip process with an etching time of 5 minutes. In some embodiments less than about 2 nm of SiOC film may be removed in a 0.5 wt % HF-dip process with an etching time of 60 minutes.

In some embodiments, the amount of etching of SiOC films according to the present disclosure may be about 1, 2, 5, 10 or more times less than an amount of etching observed for thermal $SiO_2$ (TOX) in a 0.5 wt % HF-dip process (for example in a process in which about 2 to about 3 nm TOX is removed, 1, 2, 5, 10 or more times less SiOC is removed when deposited according to the methods disclosed herein).

In some embodiments less than about 2 nm of SiOC film may be removed in a 0.5 wt % HF-dip process with an etching time of 5 minutes. In some embodiments less than about 2 nm of SiOC film may be removed in a 0.5 wt % HF-dip process with an etching time of 60 minutes.

All atomic percentage (i.e., at %) values provided herein exclude hydrogen for simplicity and because hydrogen is difficult to accurately analyze quantitatively, unless otherwise indicated. However, in some embodiments, if it is possible to analyze the hydrogen with reasonable accuracy, the hydrogen content of the films is less than about 20 at %, less than about 10 at % or less than about 5 at %. In some embodiments the deposited SiOC thin film may contain up to about 70% oxygen on an atomic basis (at %). In some embodiments a SiOC film may comprise oxygen from about 10% to about 70%, from about 15% to about 50%, or from about 20% to about 40% on an atomic basis. In some embodiments a SiOC film may comprise at least about 20%, about 40% or about 50% oxygen on an atomic basis.

In some embodiments the deposited SiOC thin film may contain up to about 40% carbon on an atomic basis (at %). In some embodiments a SiOC film may comprise carbon from about 0.1% to about 40%, from about 0.5% to about 40%, from about 1% to about 30%, or from about 5% to about 20% on an atomic basis. In some embodiments a SiOC film may comprise at least about 1%, about 10% or about 20% carbon on an atomic basis.

In some embodiments the deposited SiOC thin film may contain up to about 50% silicon on an atomic basis (at %). In some embodiments a SiOC film may comprise silicon from about 10% to about 50%, from about 15% to about 40%, or from about 20% to about 35% on an atomic basis. In some embodiments a SiOC film may comprise at least about 15%, about 20%, about 25% or about 30% silicon on an atomic basis.

In some embodiments the deposited SiOC thin film may contain up to about 40% sulfur on an atomic basis (at %). In some embodiments a SiOC film may comprise sulfur from about 0.01% to about 40%, from about 0.1% to about 40%, from about 0.5% to about 30%, or from about 1% to about 20% on an atomic basis. In some embodiments a SiOC film may comprise at least about 1%, about 10% or about 20% sulfur on an atomic basis. In some embodiments, the deposited SiOC films do not comprise an appreciable amount of nitrogen. However, in some embodiments a SiOC film comprising nitrogen is deposited. In some embodiments, the deposited SiOC films comprises less than about 30 at %, less than about 20 at %, less than about 15 at %, less than about 10 at %, less than about 5 at % of nitrogen, less than about 1 at % nitrogen, or less than about 0.1 at % nitrogen. In some embodiments the SiOC thin films do not comprise nitrogen.

As discussed above, in some embodiments a SiOC film may comprise Si—C bonds and/or Si—O bonds. In some embodiments a SiOC film may additionally comprise Si—N bonds. In some embodiments a SiOC film may additionally comprise Si—S bonds. In some embodiments a SiOC film may comprise Si—C bonds and Si—O bonds and may not comprise Si—N bonds. In some embodiments a SiOC film may comprise Si—N bonds and Si—O bonds and may not comprise Si—C bonds. In some embodiments a SiOC film may comprise Si—N bonds and Si—C bonds and may not comprise Si—O bonds. In some embodiments a SiOC film may comprise Si—S bonds, Si—C bonds, and Si—O bonds and may not comprise Si—N bonds. In some embodiments a SiOC film may comprise Si—S bonds and Si—C bonds, and may not comprise Si—O bonds. In some embodiments a SiOC film may comprise Si—S bonds, and Si—O bonds and may not comprise Si—C bonds. In some embodiments the SiOC films may comprise more Si—O bonds than Si—C bonds, for example a ratio of Si—O bonds to Si—C bonds may be from about 1:1 to about 10:1. In some embodiments a deposited SiOC film may comprise one or more of SiN, SiO, SiC, SiCN, SiON, SiOSC, SiSC, SiOS, and/or SiOC.

In some embodiments a SiOC film is not a low-k film, for example a SiOC film is not a porous film. In some embodiments a SiOC is a continuous film. In some embodiments a SiOC film has a k-value that is less than about 10. In some embodiments a SiOC film has a k-value that is less than about 7. In some embodiments a SiOC film has a k-values from about 2 to about 10. In some embodiments a SiOC film has a k-value that is less than about 5.0, less than about 4.5, less than about 4.3, less than about 4.1. In some embodiments a SiOC film has a k-value that from about 3.0 to about 7, from about 3.0 to about 5.5, from about 3.0 to about 5.0, from about 3.5 to about 4.8, from about 3.5 to about 4.7. In some embodiments a SiOC film has a k-value that is more than the k-value of any low-k film. In some embodiments a SiOC film has a k-value that is more than pure $SiO_2$.

In some embodiments SiOC films deposited according to the present disclosure do not comprise a laminate or nanolaminate structure.

In some embodiments a SiOC film deposited according to the present disclosure is not a self-assembled monolayer (SAM). In some embodiments a SiOC film deposited according to the present disclosure does not consist of separate, individual molecules which are not bonded to each other. In some embodiments a SiOC film deposited according to the present disclosure comprises a material which is substantially bonded or linked together. In some embodiments a SiOC film deposited according to the present disclosure is not a functional layer, is not amino-functionalized, and/or is not used as a functional surface. In some embodiments a SiOC film deposited according to the present disclosure is not terminated with —$NH_2$ groups. In some embodiments a SiOC film deposited according to the present disclosure does not contain a substantial amount of —$NH_2$ groups.

EXAMPLES

Exemplary SiOC thin films were deposited by a PEALD process as described herein. BTESE was used as a silicon precursor while the bottle temperature was varied from 80° C. to 110° C. $H_2$ was used as the second reactant and a plasma was generated by applying 200 W of RF power to the second reactant. Certain SiOC samples were deposited using a substrate, or deposition temperature of 200° C., while other SiOC samples were depositing using a deposition temperature of 300° C.

For some SiOC samples, the precursor pulse time was 4 seconds, the precursor purge time was 4 seconds, the plasma pulse time was 4 seconds, and the plasma purge time was 0.5 seconds. For other samples the precursor pulse time was 10 seconds, the precursor purge time was 4 seconds, the plasma pulse time was 4 seconds, and the plasma purge time was 0.5 seconds. For other samples, the precursor pulse time was 4 seconds, the precursor purge time was 10 seconds, the plasma pulse time was 4 seconds, and the plasma purge time was 0.5 seconds.

Figure 3:
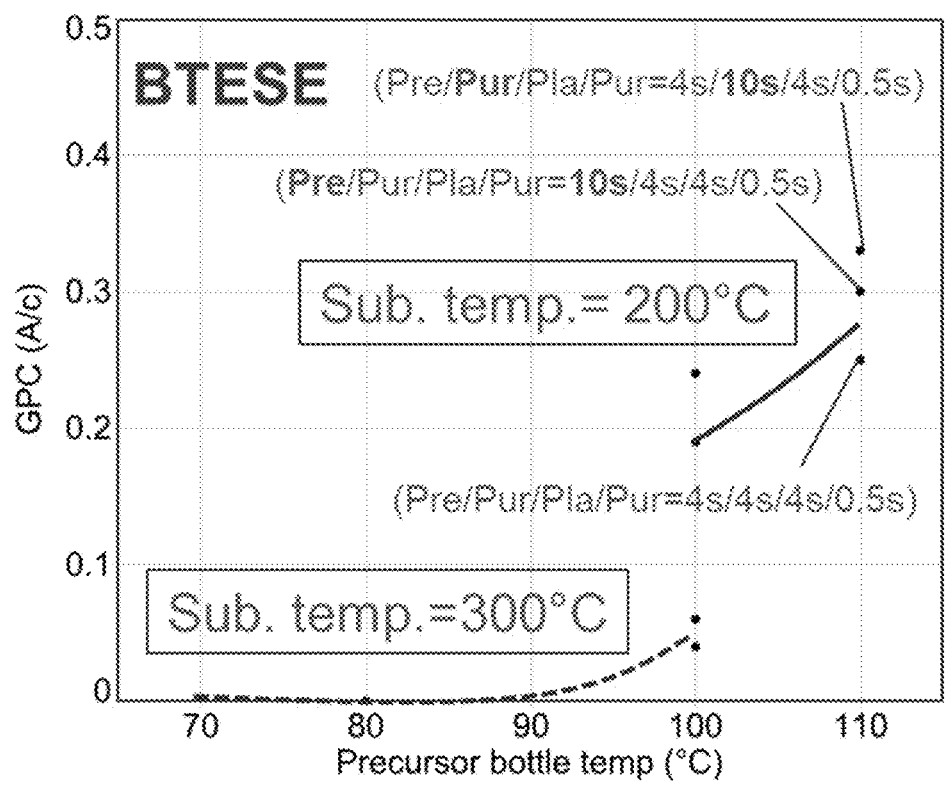
FIG. 3 illustrates a plot of precursor bottle temperature versus SiOC film growth rate for SiOC samples films deposited according to some embodiments.

FIG. 3 illustrates the growth per cycle (Å/cycle) versus the precursor bottle temperature for SiOC films deposited by the PEALD processes described herein. As can be seen in FIG. 3, the growth rate increased with increasing bottle temperature and was higher for samples deposited with a deposition temperature of 200° C. than for samples deposited with a deposition temperature of 300° C. The growth rate saturated at about 0.3 Å/cycle for a bottle temperature of 110° C. and a deposition temperature of 200° C.

Figure 4:
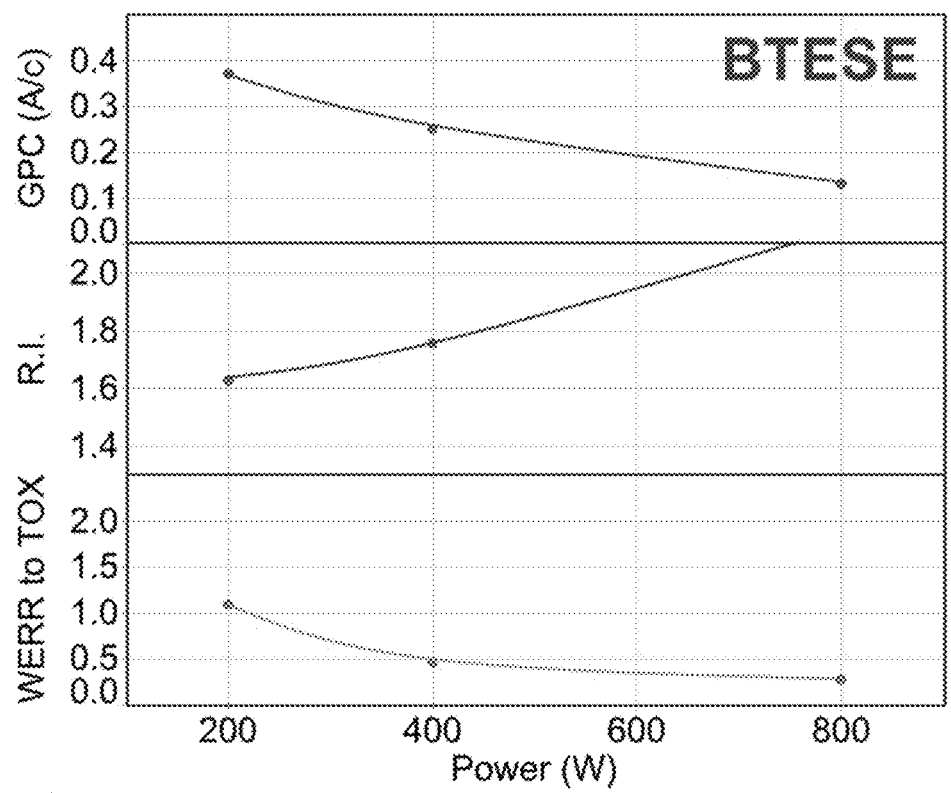
FIG. 4 depicts SiOC film growth rate, refractive index, and wet etch rate ratio to thermal silicon oxide (WERR to TOX) in dHF (0.5 wt %) as a function of plasma power for films deposited according to some embodiments.

FIG. 4 illustrates the growth per cycle (Å/cycle), refractive index, and WERR as compared with TOX in dHF (0.5 wt %) as a function of plasma power for SiOC films deposited by a PEALD process as described herein. BTESE was used as a silicon precursor and $H_2$ was used as a second reactant. A plasma was generated by applying RF power from 200 W to 800 W to the second reactant. The deposition temperature was 200° C. while the precursor pulse time was 4 seconds, the precursor purge time was 4 seconds, the plasma pulse time was 4 seconds, and the plasma purge time was 0.5 seconds.

As can be seen in FIG. 4, the growth rate of the SiOC films decreased as plasma power increased. The refractive index of the deposited films increased with increasing plasma power. The ratio of the WER of the deposited SiOC films to the WER of TOX (WERR to TOX) was observed to decrease with increasing plasma power. That is, higher wet etch resistance was obtained with increasing plasma power, reaching a WERR to TOX of 0.2 at a plasma power of 800 W.

Figure 5:
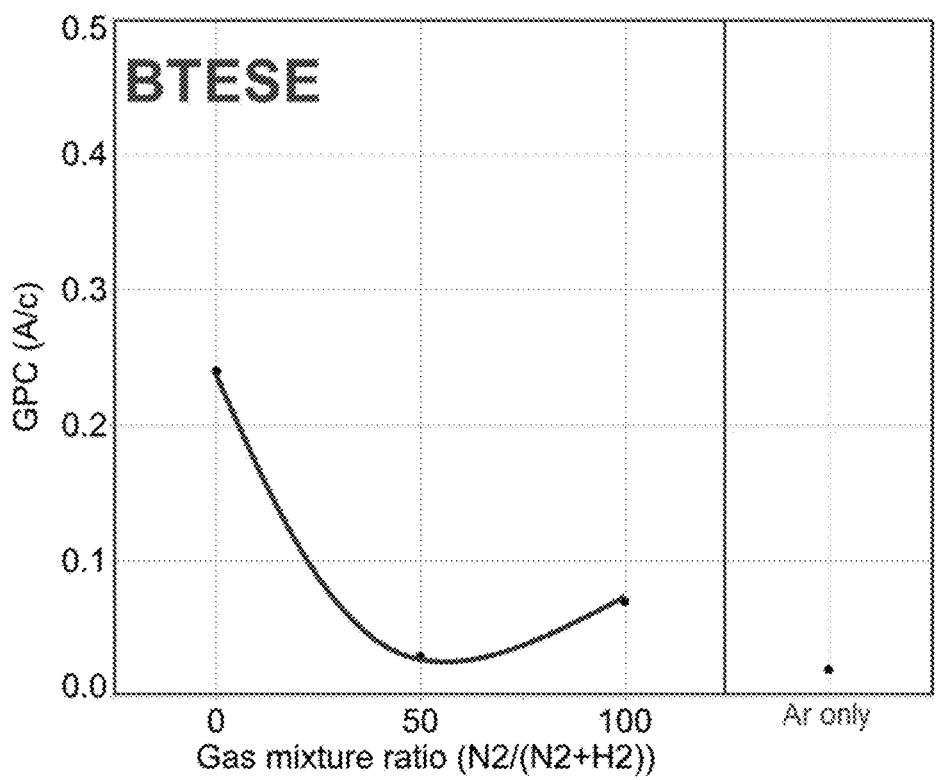
FIG. 5 depicts SiOC film growth rate versus second reactant gas composition for films deposited according to some embodiments.

FIG. 5 illustrates the growth per cycle (Å/cycle) for SiOC films deposited according to PEALD processes described herein versus second reactant gas mixture ratio ($N_2/(N_2+H_2)$). BTESE was used as a silicon precursor and the deposition temperature was 200° C. The precursor pulse time was 4 seconds, the precursor purge time was 4 seconds, the plasma pulse time was 4 seconds, and the plasma purge time was 0.5 seconds for each cycle. The second reactant gas flow was 100 sccm with 600 sccm of Ar carrier gas. The composition of the second reactant gas was varied from consisting essentially of $H_2$ to a mixture of $H_2$ and $N_2$ to consisting essentially of $N_2$ for 3 SiOC samples respectively. A sample was also prepared using only Ar carrier gas as the second reactant gas. As can be seen in FIG. 5, the highest growth rate (about 0.25 Å/cycle) was achieved using a second reactant gas consisting of essentially $H_2$ with an Ar carrier gas. Poor growth rates were observed using second reactant gases that comprised a mixture of $H_2$ and $N_2$, that consisted essentially of $N_2$, and that consisted essentially of the Ar carrier gas. Therefore, without being bound by any one theory, it is believed that the addition of $N_2$ to the second reactant gas inhibits SiOC film growth.

As used herein, the term "about" may refer to a value that is within 15%, within 10%, within 5%, or within 1% of a given value.

The terms "film" and "thin film" are used herein for simplicity. "Film" and "thin film" are meant to mean any continuous or non-continuous structures and material deposited by the methods disclosed herein. For example, "film" and "thin film" could include 2D materials, nanorods, nanotubes or nanoparticles or even single partial or full molecular layers or partial or full atomic layers or clusters of atoms and/or molecules. "Film" and "thin film" may comprise material or layer with pinholes, but still be at least partially continuous.

It will be understood by those of skill in the art that numerous and various modifications can be made without departing from the spirit of the present invention. The described features, structures, characteristics and precursors can be combined in any suitable manner. Therefore, it should be clearly understood that the forms of the present invention are illustrative only and are not intended to limit the scope of the present invention. All modifications and changes are intended to fall within the scope of the invention, as defined by the appended claims.

What is claimed is:

1. A method of forming a silicon oxycarbide (SiOC) thin film on a substrate in a reaction space by a plasma enhanced atomic layer deposition (PEALD) process, wherein the PEALD process comprises a plurality of deposition cycles comprising:
   contacting a surface of the substrate with a vapor phase silicon precursor that does not comprise nitrogen and does not comprise a halogen;
   removing excess silicon precursor and reaction byproducts, if any, from the surface of the substrate;
   contacting the surface of the substrate with at least one reactive species generated by plasma formed from a second reactant comprising hydrogen, wherein the second reactant does not comprise oxygen; and
   removing excess reactive species and reaction byproducts, if any, from the surface of the substrate.

2. The method of claim 1, wherein a ratio of a wet etch rate of the SiOC thin film to a wet etch rate of thermal silicon oxide is less than about 5.

3. The method of claim 1, wherein the SiOC thin film is deposited on a three-dimensional structure on the substrate.

4. The method of claim 3, wherein a wet etch rate ratio of a wet etch rate of SiOC formed on a vertical surface of the three-dimensional structure to a wet etch rate of the SiOC formed on a horizontal surface of the three-dimensional structure is about 1:20 to about 20:1 in 0.5 wt % dilute HF.

5. The method of claim 1, wherein the vapor phase silicon precursor comprises bis(triethoxysilyl)ethane (BTESE).

6. The method of claim 1, wherein the vapor phase silicon precursor comprises 3-methoxypropyltrimethoxysilane (MPTMS).

7. The method of claim 1, wherein the reactive species is generated from a second reactant comprising less than about 20 atomic % nitrogen.

8. The method of claim 1, wherein the SiOC thin film comprises less than about 10 at % nitrogen.

9. A method of forming a silicon oxycarbide (SiOC) thin film on a substrate in a reaction space comprising a plurality of deposition cycles comprising:
   alternately and sequentially contacting a surface of the substrate with a silicon precursor and a second reactant comprising at least one reactive species comprising hydrogen,
   wherein the at least one reactive species is generated by plasma from a gas that does not comprise oxygen,
   wherein the silicon precursor does not comprise nitrogen and does not comprise a halogen,
   wherein the deposition cycle is repeated two or more times to form the SiOC thin film, and
   wherein excess silicon precursor is removed from the surface of the substrate after contacting the surface of the substrate with the silicon precursor, and
   wherein excess reactive species are removed from the surface of the substrate after contacting the surface of the substrate with the second reactant.

10. The method of claim 9, wherein the at least one reactive species is generated by plasma formed from a gas that does not comprise nitrogen.

11. The method of claim 9, wherein the silicon precursor has a general formula:
   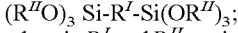
   $(R^{II}O)_3$ Si-$R^I$-Si$(OR^{II})_3$;
   wherein $R^I$ and $R^{II}$ are independently selected $C_1$-$C_5$ alkyl ligands.

12. The method of claim 11, wherein the silicon precursor comprises BTESE.

13. The method of claim 9, wherein the silicon precursor has a general formula:
   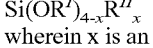
   $Si(OR^I)_{4-x}R^{II}_x$
   wherein x is an integer from 0 to 3, $R^I$ is an independently selected $C_1$-$C_7$ alkyl ligand, and $R^{II}$ is an independently selected ligand consisting of carbon, and/or hydrogen, and/or oxygen.

14. The method of claim 13, wherein the silicon precursor comprises MPTMS.

15. The method of claim 9, wherein the silicon precursor has a general formula:
   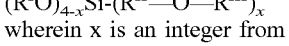
   $(R^IO)_{4-x}Si$-$(R^{II}$—$O$—$R^{III})_x$
   wherein x is an integer from 0 to 3, $R^I$ and $R^{II}$ are each independently selected $C_1$-$C_7$ alkyl ligands, and $R^{III}$ is an independently selected ligand consisting of carbon, and/or hydrogen, and/or oxygen.

16. The method of claim 9, wherein the deposition cycle is carried out at a process temperature of about 100° C. to about 300° C.

17. The method of claim 9, wherein the deposition cycle is carried out at a process temperature of less than about 100° C.

18. The method of claim 9, wherein the substrate comprises an organic material.

19. A method for depositing a silicon oxycarbide (SiOC) thin film on a substrate in a reaction space comprising:
- contacting a surface of the substrate with a silicon precursor that does not comprise nitrogen and does not comprise a halogen;
- exposing the substrate to a purge gas and/or vacuum to remove excess silicon precursor and reaction byproducts, if any;
- contacting a surface of the substrate with a second reactant comprising hydrogen, wherein the second reactant comprises at least one reactive species generated by plasma from a gas that does not comprise oxygen;
- exposing the substrate to a purge gas and/or vacuum to remove excess second reactant and reaction byproducts, if any; and
- repeating the contacting steps until a SiOC thin film of desired thickness has been formed.

* * * * *

UNITED STATES PATENT AND TRADEMARK OFFICE
CERTIFICATE OF CORRECTION

PATENT NO. : 11,562,900 B2
APPLICATION NO. : 16/811258
DATED : January 24, 2023
INVENTOR(S) : Suzuki et al.

Page 1 of 1

It is certified that error appears in the above-identified patent and that said Letters Patent is hereby corrected as shown below:

On the Title Page

Page 5, Column 2, delete "AI2O3" and insert -- Al2O3 --.

In the Specification

Column 2, Line 30, delete "$(R^{II}O)_3$ Si—$R^I$—" and insert -- $(R^{II}O)_3Si$—$R^I$— --.

Column 6, Line 11, delete "chamber" and insert -- chamber. --.

Column 11, Line 17, delete "deposition layer" and insert -- layer deposition --.

Column 16, Line 16 (approx.), delete "$Si(OR^I)_4$" and insert -- $Si(OR^I)_{4-x}R^{II}_x$ --.

Column 17, Line 8, delete "$R^{III}$" and insert -- $R^{II}$ --.

Column 24, Line 44, delete "(A/cycle)" and insert -- (Å/cycle) --.

Column 24, Line 53, delete "(A/cycle)" and insert -- (Å/cycle) --.

In the Claims

Column 26, Line 47, delete "$(R^{II}O)_3$ Si-$R^I$-$Si(OR^{II})_3$" and insert -- $(R^{II}O)_3Si$-$R^I$-$Si(OR^{II})_3$ --.

Signed and Sealed this
Ninth Day of May, 2023

*Katherine Kelly Vidal*

Katherine Kelly Vidal
*Director of the United States Patent and Trademark Office*